United States Patent
Karnezos

(10) Patent No.: US 7,061,088 B2
(45) Date of Patent: Jun. 13, 2006

(54) SEMICONDUCTOR STACKED MULTI-PACKAGE MODULE HAVING INVERTED SECOND PACKAGE

(75) Inventor: Marcos Karnezos, Palo Alto, CA (US)

(73) Assignee: ChipPAC, Inc., Fremont, CA (US)

( * ) Notice: Subject to any disclaimer, the term of this patent is extended or adjusted under 35 U.S.C. 154(b) by 0 days.

(21) Appl. No.: 10/681,572

(22) Filed: Oct. 8, 2003

(65) Prior Publication Data

US 2004/0113253 A1    Jun. 17, 2004

Related U.S. Application Data

(63) Continuation-in-part of application No. 10/618,933, filed on Jul. 14, 2003.

(60) Provisional application No. 60/460,541, filed on Apr. 4, 2003, provisional application No. 60/417,277, filed on Oct. 8, 2002.

(51) Int. Cl.
  *H01L 23/02* (2006.01)
  *H01K 1/14* (2006.01)

(52) U.S. Cl. ............... 257/686; 257/784; 257/787; 361/736; 361/760; 361/776

(58) Field of Classification Search .......... 257/678, 257/685–687, 738, 782, 777–780, 783, 784, 257/706, 707, 712, 713, 717, 720, 787
See application file for complete search history.

(56) References Cited

U.S. PATENT DOCUMENTS

| | | | |
|---|---|---|---|
| 5,222,014 A | 6/1993 | Lin | 361/414 |
| 5,444,296 A | 8/1995 | Kaul et al. | |
| 5,744,863 A | 4/1998 | Culnane et al. | |
| 5,994,166 A | 11/1999 | Akram et al. | 438/108 |
| 6,157,080 A | 12/2000 | Tamaki et al. | 257/738 |
| 6,265,766 B1 | 7/2001 | Moden | 257/678 |
| 6,407,456 B1 | 6/2002 | Ball | 257/777 |
| 6,413,798 B1 | 7/2002 | Asada | 438/108 |
| 6,414,381 B1 | 7/2002 | Takeda | 257/676 |
| 6,462,421 B1 | 10/2002 | Hsu et al. | |
| 6,472,741 B1 | 10/2002 | Chen et al. | 257/712 |
| 6,512,303 B1 | 1/2003 | Moden | 257/778 |
| 6,545,366 B1 | 4/2003 | Michii et al. | 257/777 |
| 6,552,423 B1 | 4/2003 | Song et al. | 257/679 |
| 6,590,281 B1 | 7/2003 | Wu et al. | 257/684 |
| 6,593,648 B1 | 7/2003 | Emoto | 257/696 |
| 6,607,937 B1 | 8/2003 | Corisis | 438/108 |
| 6,649,448 B1 | 11/2003 | Tomihara | 438/113 |
| 6,667,556 B1 | 12/2003 | Moden | 257/778 |
| 6,716,676 B1 | 4/2004 | Chen et al. | 438/122 |
| 6,734,539 B1 | 5/2004 | Degani et al. | 257/686 |

(Continued)

FOREIGN PATENT DOCUMENTS

JP    2001223326 A    8/2001

(Continued)

*Primary Examiner*—Alonzo Chambliss
(74) *Attorney, Agent, or Firm*—Bill Kennedy; Haynes Beffel & Wolfeld LLP

(57) ABSTRACT

A semiconductor multi-package module has stacked lower and upper packages, each package including a die attached to a substrate, in which the upper and lower substrates are interconnected by wire bonding, and in which the upper package is inverted. Also, a method for making a semiconductor multi-package module, by providing a lower molded package including a lower substrate and a die, affixing an upper molded package including an upper substrate in inverted orientation onto the upper surface of the lower package, and forming z-interconnects between the upper and lower substrates.

11 Claims, 20 Drawing Sheets

U.S. PATENT DOCUMENTS

| | | | |
|---|---|---|---|
| 6,734,552 B1 | 5/2004 | Combs et al. | 257/707 |
| 6,737,750 B1 | 5/2004 | Hoffman et al. | 257/777 |
| 6,746,894 B1 | 6/2004 | Fee et al. | 438/106 |
| 6,762,488 B1 | 7/2004 | Maeda et al. | |
| 6,777,819 B1 | 8/2004 | Huang | 257/796 |
| 6,787,916 B1 * | 9/2004 | Halahan | 257/777 |
| 6,835,598 B1 * | 12/2004 | Baek et al. | 438/109 |
| 6,838,761 B1 | 1/2005 | Karnezos | 257/685 |
| 6,864,566 B1 * | 3/2005 | Choi, III | 257/676 |
| 6,906,416 B1 * | 6/2005 | Karnezos | 257/723 |
| 2003/0230801 A1 | 12/2003 | Jiang et al. | 257/723 |
| 2004/0100772 A1 | 5/2004 | Chye et al. | 361/702 |

FOREIGN PATENT DOCUMENTS

| | | |
|---|---|---|
| KR | 2001068614 A | 7/2001 |
| KR | 2004085348 A | 10/2004 |

* cited by examiner

SEMICONDUCTOR STACKED MULTI-PACKAGE MODULE HAVING INVERTED SECOND PACKAGE

CROSS-REFERENCE TO RELATED APPLICATIONS

This application claims the benefit of U.S. Provisional Application No. 60/417,277, filed 8 Oct. 2002, titled "Semiconductor multi-package module having inverted second package", which is hereby incorporated herein by reference. This application also claims the benefit of U.S. Provisional Application No. 60/460,541, filed 4 Apr. 2003, and Continuation-in-part of U.S. application Ser. No. 10/618,933, filed 14 Jul. 2003, both titled "Semiconductor multi-package module including processor and memory package assemblies", which are hereby incorporated herein by reference.

This application is related to U.S. Application No. U.S. application Ser. No. 10/681,735, titled "Semiconductor multi-package module having inverted land grid array (LGA) package stacked over ball grid array (BGA) package"; U.S. application Ser. No. 10/681,833, titled "Semiconductor stacked multi-package module having inverted second package and electrically shielded first package" which issued Aug. 23, 2005 as U.S. Pat. No. 6,933,598; U.S. application Ser. No. 10/681,583, titled "Semiconductor multi-package module having inverted second package stacked over die-down flip-chip ball grid array (BGA) package"; U.S. application Ser. No. 10/681,747, titled "Semiconductor multi-package module having inverted second package stacked over die-up flip-chip ball grid array (BGA) package" which issued Jun. 14, 2005 as U.S. Pat. No. 6,906,416; U.S. application Ser. No. 10/681,584, titled "Semiconductor multi-package module having inverted second package and including additional die or stacked package on second package"; U.S. application Ser. No. 10/681,734, titled "Semiconductor multi-package module having inverted bump chip carrier second package"; all filed 8 Oct. 2003, and each of which is hereby incorporated by reference.

BACKGROUND

This invention relates to semiconductor packaging.

Portable electronic products such as mobile phones, mobile computing, and various consumer products require higher semiconductor functionality and performance in a limited footprint and minimal thickness and weight at the lowest cost. This has driven the industry to increase integration on the individual semiconductor chips.

More recently the industry has begun implementing integration on the "z-axis," that is, by stacking chips, and stacks of up to five chips in one package have been used. This provides a dense chip structure having the footprint of a one-chip package, in the range of 5×5 mm to 40×40 mm, and obtaining thicknesses that have been continuously decreasing from 2.3 mm to 0.5 mm. The cost of a stacked die package is only incrementally higher than the cost of a single die package and the assembly yields are high enough to assure a competitive final cost as compared to packaging the die in individual packages.

The primary practical limitation to the number of chips that can be stacked in a stacked die package is the low final test yield of the stacked-die package. It is inevitable that some of the die in the package will be defective to some extent, and therefore the final package test yield will be the product of the individual die test yields, each of which is always less than 100%. This can be particularly a problem even if only two die are stacked in a package but one of them has low yield because of design complexity or technology.

Another limitation is the low power dissipation of the package. The heat is transmitted from one die to the other and there is no significant dissipation path other than through the solder ball to the motherboard.

A further limitation is electromagnetic interference between the stacked die, particularly between RF and digital die, because there is no electrical shielding of either die.

Another approach to integrating on the "z-axis" is to stack die packages to form a multi-package module. Stacked packages can provide numerous advantages as compared to stacked-die packages.

For instance, each package with its die can be electrically tested, and rejected unless it shows satisfactory performance, before the packages are stacked. As a result the final stacked multi-package module yields are maximized.

More efficient cooling can be provided in stacked packages, by inserting a heat spreader between the packages in the stack as well as at the top of the module.

Package stacking allows electromagnetic shielding of the RF die and avoids interference with other die in the module.

Each die or more than one die can be packaged in a respective package in the stack using the most efficient first level interconnect technology for the chip type and configuration, such as wire bonding or flip chip, to maximize performance and minimize cost.

The z-interconnect between packages in a stacked multi-package module is a critical technology from the standpoint of manufacturability, design flexibility and cost. Z-interconnects that have been proposed include peripheral solder ball connection, and flexible substrate folded over the top of the bottom package. The use of peripheral solder balls for z-interconnects in stacked multi-package modules limits the number of connections that can be made and limits design flexibility, and results in a thicker and higher cost package. Although the use of a flexible folding substrate provides in principle for design flexibility, there is no established manufacturing infrastructure for the folding process. Moreover, the use of a flexible folding substrate requires a two metal layer flex substrate, and these are expensive. Furthermore the folded flexible substrate approach is restricted to low pincount applications because of limits in routing the circuitry in two metal layer substrates.

The various z-interconnect structures are described in further detail with reference to FIGS. 1A, 1B and 2–4.

FIG. 1A is a diagrammatic sketch in a sectional view illustrating the structure of a standard Ball Grid Array ("BGA") package, well established in the industry, that can be used as a bottom package in a stacked multi-package module ("MPM"). The BGA, shown generally at 10, includes a die 14 attached onto a substrate 12 having at least one metal layer. Any of various substrate types may be used, including for example: a laminate with 2–6 metal layers, or a build up substrate with 4–8 metal layers, or a flexible polyimide tape with 1–2 metal layers, or a ceramic multi-layer substrate. The substrate 12 shown by way of example in FIG. 1A has two metal layers 121, 123, each patterned to provide appropriate circuitry and connected by way of vias 122. The die is conventionally attached to a surface of the substrate using an adhesive, typically referred to as the die attach epoxy, shown at 13 in FIG. 1A and, in the configuration in FIG. 1A, the surface of the substrate onto which the die is attached may be referred to as the "upper" surface, and the metal layer on that surface may be referred to as the "upper" metal layer, although the die attach surface need not have any particular orientation in use.

In the BGA of FIG. 1A the die is wire bonded onto wire bond sites on the upper metal layer of the substrate to establish electrical connections. The die 14 and the wire bonds 16 are encapsulated with a molding compound 17 that provides protection from ambient and from mechanical stress to facilitate handling operations, and provides a surface for marking for identification. Solder balls 18 are reflowed onto bonding pads on the lower metal layer of the substrate to provide interconnection to the motherboard (not shown in the FIGS.) of a final product, such as a computer. Solder masks 125, 127 are patterned over the metal layers 121, 123 to expose the underlying metal at bonding sites for electrical connection, for example the wire bond sites and bonding pads for bonding the wire bonds 16 and solder balls 18.

FIG. 1B is a diagrammatic sketch in a sectional view illustrating the structure of a BGA, generally similar to the BGA 11 shown in FIG. 1A, except that here the molding 117 completely covers the substrate as well as the die and wire bonds. The molding configuration of FIG. 1B is formed by applying the molding compound over an array of a number of BGAs, curing the molding, and then separating the encapsulated packages, for example by saw singulation. Typically the molding in such a package has vertical walls at the edges of the package. In such a package, unlike a BGA as in FIG. 1A, no marginal portion of the upper surface of the substrate 12 is exposed and, accordingly, no electrical traces are exposed on the upper surface of the substrate. Many smaller packages currently are saw-singulated packages, often referred to as "chip scale packages."

FIG. 2 is a diagrammatic sketch in a sectional view illustrating the structure of an example of a 2-stack MPM, generally at 20, in which the z-interconnect is made by way of solder balls. In this MPM a first package (which may be referred to as the "bottom" package) is similar to a standard BGA as shown in FIG. 1A (and similar reference numerals are employed to point to similar features of the bottom package in FIGS. 1A and 2). A second package (which may be referred to as the "top" package) is stacked on the bottom package and is similar in structure to the package of FIG. 1B (and similar reference numerals are employed to point to similar features of the top package in FIGS. 1B and 2), except that the solder balls in the top package are arranged at the periphery of the top package substrate, so that they effect the z-interconnect without interference with the encapsulation of the bottom BGA. Particularly, the top package in FIG. 2 includes a die 24 attached onto a substrate 22 having at least one metal layer. The top package substrate 22 shown by way of example in FIG. 2 has two metal layers 221, 223, each patterned to provide appropriate circuitry and connected by way of vias 222. The die is conventionally attached to a surface of the substrate (the "upper" surface) using an adhesive, typically referred to as the die attach epoxy, shown at 23 in FIG. 2.

In the top package in the MPM of FIG. 2, as in the bottom package, the die is wire bonded onto wire bond sites on the upper metal layer of the substrate to establish electrical connections. The top package die 24 and wire bonds 26 are encapsulated with a top package molding compound 27. Solder balls 28 are reflowed onto bonding pads located on the peripheral margin of the lower metal layer of the top package substrate to provide z-interconnection to the bottom package. Solder masks 225, 227 are patterned over the metal layers 221, 223 to expose the underlying metal at bonding sites for electrical connection, for example the wire bond sites and bonding pads for bonding the wire bonds 26 and solder balls 28.

The z-interconnection in the MPM of FIG. 2 is achieved by reflowing the solder balls 28 attached to peripheral bonding pads on the lower metal layer of the top package substrate onto peripheral bonding pads on the upper metal layer of the bottom BGA. This type of z-interconnect requires that the upper and lower substrates be designed with matching pads for the interconnect balls. If one of the packages is exchanged for one in which the substrate has a different pad arrangement (different size or different design), then the substrate for the other package must be reconfigured accordingly. This leads to increased cost for manufacture of the MPM. In this configuration the distance h between the top and bottom packages must be at least as great as the encapsulation height of the bottom package, which may be 0.25 mm or more, and typically is in a range between 0.5 mm and 1.5 mm. The solder balls 28 must accordingly be of a sufficiently large diameter that when they are reflowed they make good contact with the bonding pads of the bottom BGA; that is, the solder ball 28 diameter must be greater than the encapsulation height. A larger ball diameter dictates a larger ball pitch that in turn limits the number of balls that can be fitted in the available space. Furthermore the peripheral arrangement of the solder balls forces the bottom BGA to be significantly larger than the mold cap of a standard BGA. Furthermore the peripheral arrangement of the solder balls increases the overall package size (the size increases according to the number of ball rows and the ball pitch). In small BGAs, usually referred to as Chip Scale Packages ("CSP"), the package body size is 1.7 mm larger than the die. In standard BGAs the body size can be as much as about 2–3 mm larger than the mold cap. Moreover, the top package in such a configuration must be made of comparable size to the bottom one even though it may contain a small chip with many fewer interconnects. In this configuration the top package substrate must have at least 2 metal layers to facilitate the electrical connections.

FIG. 3 is a diagrammatic sketch in a sectional view illustrating the structure of an example of a known 2-stack flip chip MPM, shown generally at 30. In this configuration the bottom BGA flip chip package includes a substrate 32 having a patterned metal layer 31 onto which the die 34 is connected by flip chip bumps 36, such as solder bumps, gold stud bumps or anisotropically conducting film or paste. The flip chip bumps are affixed to a patterned array of bump pads on the active surface of the die and, as the active surface of the die faces downward in relation to an upward-facing patterned metal layer of the substrate, such an arrangement may be referred to as a "die down" flip chip package. A polymer underfill 33 between die and substrate provides protection from ambient and adds mechanical integrity to the structure. Such a flip chip package, in which the substrate has a metal layer on only the upper surface, is connected to the underlying circuitry (such as a motherboard, not shown in the FIG.) by solder balls 38 connected to the metal layer through solder vias 35.

The top BGA in this configuration is similar to the bottom BGA, except that the top BGA has z-interconnect solder balls 338 connected (through solder vias 335 in the top substrate) to the metal layer 331 only at the periphery of the top substrate. Solder balls 338 are reflowed onto the metal layer 31 of the bottom substrate to provide the z-interconnect. Particularly, the top BGA in this configuration includes a substrate 332 having a patterned metal layer 331 onto which the top BGA die 334 is connected by flip chip bumps 336. Between the top BGA die and substrate is a polymer underfill 333. A structure as in FIG. 3 is more appropriate for high electrical performance applications, but it has similar limitations to configurations of the type shown in of FIG. 2. It presents an improvement over the FIG. 2 configuration in that the bottom BGA has no molding, allowing for use of smaller diameter (h) solder balls at the periphery of the top BGA for connection between the packages.

Particularly, this structure is more appropriate, for example, for modules containing stacks of identical memory chips having the same connections at the same locations to facilitate the z-interconnect. It is not appropriate for stacking packages that have different chips with connection points not located over one another in the stack. As in the configuration of FIG. 2, the peripheral arrangement of solder balls limits the number of interconnects. Moreover, the packages must necessarily be of comparable size, and where the chip in one package is smaller than that in the other, the package having the smaller chip will be forced to a larger size, imposing a higher cost.

FIG. 4 is a diagrammatic sketch in a sectional view illustrating the structure of an example of a known 2-stack folded flexible substrate MPM, shown generally at 40. The bottom package in the configuration of FIG. 4 has a 2-metal layer flexible substrate onto which the die is bonded via small beams to the first metal layer of the substrate. The second metal layer of the bottom package substrate carries the solder balls for connection to the underlying circuitry, such as a motherboard (not shown). The substrate is large enough to be folded over the top of the package, thus bringing the electrical interconnect lines upward where they are available for connection to the top package (an example of which is described below) by way of an array of solder balls on the top package. The space around the die and between the die and folded-over substrate is encapsulated 47 to provide protection and rigidity.

Referring to FIG. 4, the two-metal layer bottom package substrate 42 includes a first metal layer 141 and a second metal layer 143, each patterned to provide appropriate circuitry and connected by way of vias 142. A part of the first metal layer, over a part of the bottom substrate, is processed (for example, using an array of punches) to present an array of cantilever beams or tabs 46 arranged to correspond to an array of interconnect pads on the active surface of the bottom package die 44. Over this part of the substrate 42, which may be referred to as the "die attach part", the first metal layer 141 faces upwardly. The die is aligned, active surface downward, over the die attach part of the substrate, and the cantilevers and the corresponding interconnect pads are joined, typically for example by a "thermosonic" process employing a combination of pressure, heat, and ultrasonic energy to complete the electrical connections. The die 44 is affixed using an adhesive 43, typically a die attach epoxy, onto the die attach part of the flexible substrate 42. A second metal layer 143 of the bottom package substrate 42 faces downwardly in the die attach part of the substrate. Solder balls 48 are reflowed onto bonding pads located on an array on the downward-facing part of the second metal layer 143 to provide for interconnection of the MPM to underlying circuitry (not shown). A solder mask 147 is patterned over the second metal layer 143 to expose the underlying metal as bonding sites for electrical connection, including the bond pads for connection with the underlying circuitry by way of solder balls 48, and the bond pads for connection with the top package by way of solder balls 18, as described below.

Another part of the bottom package substrate 42, extending adjacent the die-attach portion, is folded up and over the bottom package die 44. On this folded-over portion of the flexible substrate 42 the first metal layer 143 faces upwardly. In the configuration of FIG. 4 the top package is generally similar to the BGA of FIG. 1, in which the die is wire bonded onto wire bond sites on the upper metal layer of the substrate to establish electrical connections. Particularly, the top package die 14 is attached onto a substrate 12 having (in this example) two metal layers 121, 123, each patterned to provide appropriate circuitry and connected by way of vias 122. The die is conventionally attached to the upper surface of the top package substrate using an adhesive 13, typically a die attach epoxy. The die 14 and the wire bonds 16 are encapsulated with a molding compound 17 that provides protection from ambient and from mechanical stress to facilitate handling operations, and provides a surface for marking for identification. Solder balls 18 are reflowed onto bonding pads 143 on the upward-facing metal layer of the folded-over bottom package substrate to provide z-interconnection between the top and the bottom packages.

An advantage of a structure as in FIG. 4 is that the folded-over substrate provides sufficient area on the upward-facing surface of the folded-over bottom package substrate to accommodate a full array of solder balls in the top package and to accommodate more complex interconnect between the two packages. It also provides for a small package footprint. A primary disadvantage of this configuration is the high cost of the substrate and the unavailability of folding technology and equipment.

A lack of folding technology and equipment makes manufacture of the 2-stack folded flexible substrate MPM configuration more complex and more costly. The two substrates must be designed such that the pads match for the interconnect balls. If one of the packages is exchanged for one in which the substrate has a different pad arrangement (different size or different design), then the substrate for the other package must be reconfigured accordingly. This leads to increased cost for manufacture of the MPM. Moreover, all the interconnects from the top to the bottom package must be routed through the folded portion of the flex substrate at one edge of the package. This increases the routing density and increases the length of the routing traces, resulting in higher inductance and lower electrical performance of the MPM.

A common feature of all these stacked package configurations is that they enable pretesting of each package, and provide for production MPMs with higher final test yields.

SUMMARY

This invention is directed to multi-package modules. According to the invention, z-interconnection between the stacked packages in the MPM is wire bond based, and an upper package is inverted. Generally, the invention features various configurations of various stacked packages, including a bottom (lower) package and at least one inverted top (upper) package, and methods for stacking and interconnecting the various packages by wire-bonding based z-interconnection.

In the multi-package module according to the invention the package stack can include any of a variety of BGA and/or any of a variety of Land Grid Array ("LGA") packages and/or any of a variety of bump chip carrier packages; the package stack can include wire bonded and/or flip chip packages; the package stack can include a thermal enhancement feature enabled by one or more heat spreaders in or on the stack; the package stack can include one or more packages having a flip chip bonded die bonded either to the top or to the bottom of the BGA or LGA; the package stack can include one or more BGA and/or LGA having more than one die in the package stacked or side by side; the stack can include electromagnetic shield for one or more of the packages; and the stack can include any substrate, laminate or build-up or flexible or ceramic, provided that the z-interconnect pads are made available for bonding on the periphery of the packages.

In one general aspect the invention features a multi-package module having stacked lower and upper packages, each package including a die attached to a substrate, in which the upper package is inverted and the upper and lower substrates are interconnected by wire bonding.

The invention provides for excellent manufacturability, high design flexibility, and low cost to produce a stacked package module having a low profile and a small footprint. The wire bond z-interconnect is well established in the industry; it is the lowest cost interconnect technique and it is directly applicable, without significant modification, to the stacked multi-package modules of the invention. It provides design flexibility to the relative size of the BGA to LGA that can be bridged by wire length. Using available techniques and equipment the wire in a wire bond can be as short as 0.5 mm or as long as 5 mm. The arrangement of the z-interconnect pads can be implemented through either or both BGA and LGA substrate designs. Moreover, using wire bonds according to the invention z-interconnect can be formed between pads that are not precisely aligned over one another, by employing so-called "out of sequence bonding" that is in current use in the industry. The wire bonding pitch is the finest available technology in the industry at 50 microns currently, and projected to go to 25 microns. This is finer than any other interconnect including flip chip (around 200 microns) or solder balls (at about 500 microns), and therefore provides for more interconnects between packages (z-interconnects) in the same available space.

Wire bonding using a wire bonding machine provides design flexibility for interconnecting pads, because the connections are programmed in the wire bonder, avoiding the need for hard tooling substrates to match each other and connect with solder balls. When the relative BGA and LGA package sizes change, the wire bonding can be reconfigured to accommodate the differences by program changes. If the top package must be smaller than the bottom, wire bonding can accommodate size differences at least up to 9 mm. This allows for use of the smallest package needed to accommodate the chip size, and thus optimizes the total cost of the MPM.

Wire bonding can interconnect pads that are "out of sequence," that is, not situated in the desired order and not precisely above each other in either package, so long as they are not too far apart. Where necessary, the pads can be appropriately routed to a location close enough for wire bonding. This flexibility allows stacking of packages that do not have the "desired" order or location of interconnect pads. As the chip technology advances usually the chip size shrinks and design variants are developed with either more connections or some connections with different order. The bonding flexibility provided by wire bonding allows the user to maintain the same package size but vary the substrate design. This results in lower cost and faster time to market, both critical for new products.

The BGAs and LGAs, including chip scale packages, are standard in the industry, providing the lowest cost and the widest availability. This provides significant flexibility in selecting the packages to be stacked and, therefore, in the kinds of functions that can be integrated into the MPM.

A typical BGA thickness is 1.0 mm and LGA thickness is 0.8 mm. The stacking of an inverted LGA on top of a BGA according to the invention can be completed using an adhesive having a finished thickness in the range 10–50 microns. This structure provides for a lower profile MPM compared to conventional constructs that employ solder balls for the z-interconnect. The footprint of the MPM according to the invention is determined by the maximum chip size of the stack. A typical minimum footprint for the BGA or LGA is 1.7 mm larger than the die size. The wire bond z-interconnect generally requires that the top LGA be minimally smaller than the bottom BGA, by about 0.1 mm to 0.8 mm, to accommodate the wires without shorting to the substrate metal edges. If the top package must be significantly smaller than the bottom package, wire bonding can accommodate size differences at least up to 9 mm. This allows for minimizing the size of the package needed to accommodate the chip size, and thus for optimizing the total cost of the MPM. Both the footprint and the thickness of the stacked package MPM according to the invention fall within accepted ranges for most applications.

In some embodiments the multi-package module includes three or more packages, affixed serially to form a stack.

In one general aspect the invention features a multi-package module having stacked first ("bottom") and second ("top") packages, the bottom package being a BGA package and the top package being an LGA package, each package including a first die attached to a substrate, in which the LGA package substrate and the BGA package substrate are interconnected by wire bonding, and in which the LGA package substrate is inverted so that the LGA substrate surface to which its die is attached is downward. In some embodiments the second package is an LGA package, and in some embodiments the second package is a saw-singulated package, and may be a chip scale package. In some embodiments the second package is a bump chip carrier package.

In another aspect the invention features a multi-package module having stacked first ("bottom") and second ("top") packages, the bottom package being a BGA package and the top package being an inverted LGA package, in which the inverted LGA package substrate and the BGA package substrate are interconnected by wire bonding, and in which at least one of the packages is provided with a heat spreader. In some such configurations a heat spreader may additionally be configured to serve as an electrical shield, particularly for example where the heat spreader is situated over a lower die, that is, between a bottom and a top package in the stack. In some embodiments the heat spreader is affixed to the upward surface of a topmost LGA package, and in such embodiments the heat spreader is exposed to ambient at the topmost surface of the MPM.

In another aspect the invention features a multi-package module having stacked first ("bottom") and second ("top") packages, the bottom package being a flip-chip BGA package having a flip-chip in a "die-up" configuration and the top package being an inverted LGA package, in which the top substrate and the bottom package are interconnected by wire bonding. In some embodiments the top package is a stacked die package; in some embodiments the adjacent stacked die in the stacked die package can be separated by spacers. In some embodiments the die on the BGA package is at least partially enclosed within an electrical shield (a "can" or "cage) affixed to the under surface of the BGA substrate. In some embodiments the bottom package substrate includes an embedded ground plane, the ground plane being configured to serve also for heat dissipation and as an electrical shield. In some embodiments a plurality of inverted second ("top") packages is affixed over a plurality of die attach regions on the upper surface of the first ("bottom") package substrate.

In another aspect the invention features a multi-package module having stacked first ("bottom") and second ("top") packages, the bottom package being a flip-chip BGA package having a flip-chip in a "die-down" configuration and the top package being an inverted LGA package, in which the top substrate and the bottom package are interconnected by wire bonding. In some embodiments the flip-chip die on the bottom package is provided with an electrical shield.

In another aspect the invention features a multi-package module having stacked first ("bottom") and second ("top") packages, the bottom package being a BGA package and the top package being an inverted LGA package, in which the inverted LGA package substrate and the BGA package substrate are interconnected by wire bonding, and in which either the top LGA package or the bottom BGA package is a stacked die package, that is, the package includes a stack of two or more die connected to a surface of the substrate; or in which both packages are stacked die packages.

In some such embodiments the top LGA package may include a stack of two or more die affixed to, and connected (as for example by wire bonding) to the upside of the LGA substrate (oriented downward in the inverted LGA package).

In another aspect the invention features a multi-package module having stacked bottom and top packages, the bottom package being a BGA package and the top package being an inverted LGA package, in which an additional die is attached to the bottom surface of the LGA substrate (oriented upward in the inverted LGA package), that is, on the LGA substrate surface opposite the surface to which a first die is attached. In such embodiments there is at least one die on both the upper and the lower (downward and upward) surfaces of the LGA substrate. In some embodiments the interconnect of the additional die on the LGA substrate is by wire bonding to the LGA substrate; in some embodiments the interconnect of the additional die on the LGA substrate is a is flip chip interconnect.

In another aspect the invention features a multi-package module having stacked bottom and top packages, the bottom package being a BGA package and the top package being an inverted LGA package, in which a third package is affixed upon the top LGA package. In some embodiments the third package is a second inverted LGA package, and the z-interconnect between the third package is by wire bonding; in some embodiments the third package is not inverted, and the z-interconnect with the inverted LGA package is by solder balls between ball pads on the lower surface (downward surface) of the third package and ball pads on the lower surface (that is, the upward surface) of the inverted LGA package.

In another aspect the invention features a multi-package module having stacked first ("bottom") and second ("top") packages, the bottom package being a BGA package and the top package being a bump chip carrier package, in which the bump chip carrier package substrate and the BGA package substrate are interconnected by wire bonding, and in which the bump chip carrier package is inverted so that the substrate surface to which its die is attached is oriented downward.

In another general aspect the invention features a method for making a multi-package module, by providing a first ("bottom") molded package including a bottom package substrate and a die, dispensing adhesive onto an upper surface of the bottom molded package, placing a second ("top") package including a top package substrate and a die in an inverted orientation such that an upper (downward) surface of the top package substrate contacts the adhesive on the upper surface of the bottom package, curing the adhesive, and forming z-interconnects between the top and bottom substrates.

In some embodiments the multi-package module includes a third or additional packages, and the method includes affixing the third or additional packages serially to form a stack.

In one aspect the invention features a method for making a multi-package module including an inverted top package, which may be an LGA package or a bump chip carrier ("BCC") package stacked over a bottom BGA package, in which the top and bottom packages are electrically interconnected by wire bonding. According to this aspect, a BGA package is provided, usually in an unsingulated strip of molded BGA packages; preferably the BGA packages in the strip are tested for performance and reliability and packages identified as "good" are subjected to subsequent treatment; adhesive is dispensed over the upper surface of the molding on "good" BGA packages; a singulated (for example, saw-singulated) molded land grid array package or bump chip carrier package is provided; preferably the LGA package or BCC package is tested and identified as "good"; the "good" LGA or BCC package is inverted and placed onto the adhesive over the molding on the "good" BGA package, and the adhesive is cured; optionally and preferably a plasma clean operation is performed followed by formation of wire bond z-interconnections between the stacked top and bottom packages; optionally and preferably an additional plasma clean may be performed, followed by the formation of the MPM molding. Further steps include attachment of second-level interconnect solder balls to the underside of the module; testing and singulation of the completed module from the strip, for example by saw singulation or by punch singulation; and packaging for further use.

In some embodiments the method includes steps for providing the multi-package module with a heat spreader. In this aspect of the invention a similar process is performed, with additional steps interposed installation of supported heat spreader by a "drop-in" mold operation, or for installation of a simple planar heat spreader by a drop-in mold operation; or by applying adhesive onto an upper surface of the top package molding or onto an upper surface of a spacer upon the top package, and affixing the planar heat spreader onto the adhesive.

In another aspect the invention features a method for making a multi-package module including an inverted top package stacked over a die-down flip chip BGA bottom package, in which the top and bottom packages are electrically interconnected by wire bonding. According to this aspect, a die-down flip chip BGA bottom package, optionally molded, is provided, usually in unsingulated strip of die-down flip chip ball grid array bottom packages; preferably the BGA packages in the strip are tested for performance and reliability and packages identified as "good" are subjected to subsequent treatment; adhesive is dispensed onto the upper surface (back side) of the die on "good" BGA packages; singulated top (e.g., land grid array or bump chip carrier) packages, optionally molded, are provided; preferably the LGA or BCC package is tested and identified as "good"; the "good" LGA or BCC package is inverted and placed onto the adhesive over the shield, and the adhesive is cured; optionally and preferably a plasma clean operation is performed followed by formation of wire bond z-interconnections between the stacked top and bottom packages; optionally and preferably an additional plasma clean may be performed, followed by the formation of the MPM molding. Further steps include attachment of second-level interconnect solder balls to the underside of the module; testing and singulation of the completed module from the strip, for example by saw singulation or by punch singulation; and packaging for further use.

In another aspect the invention features a method for making a multi-package module including an inverted top package stacked over a die-down flip chip BGA bottom package, in which the top and bottom packages are electrically interconnected by wire bonding, and in which the bottom package is provided with an electrical shield. According to this aspect, a process is performed similar to that described above for the unshielded bottom flip chip bottom package, with an additional step interposed for installation of the shield over the bottom package flip chip die. A die-down flip chip BGA bottom package, optionally molded, is provided, usually in unsingulated strip of die-down flip chip ball grid array bottom packages; preferably the BGA packages in the strip are tested for performance and reliability and packages identified as "good" are subjected to subsequent treatment; an electrical shield is affixed over the die on "good" bottom BGA packages; adhesive is dispensed onto the upper surface of the shield on "good" BGA packages; singulated top (e.g., land grid array or bump chip carrier) packages, optionally molded, are provided; preferably the LGA or BCC package is tested and identified as "good"; the "good" LGA or BCC package is inverted and placed onto the adhesive over the shield, and the adhesive is cured; optionally and preferably a plasma clean operation is performed followed by formation of wire bond z-interconnections between the stacked top and bottom packages; optionally and preferably an additional plasma clean may be performed, followed by the formation of the MPM molding. Further steps include attachment of second-level interconnect solder balls to the underside of the module; testing and singulation of the completed module from the strip, for example by saw singulation or by punch singulation; and packaging for further use.

In another aspect the invention features a method for making a multi-package module including an inverted top package stacked over a die-up flip chip BGA bottom package, in which the top and bottom packages are electrically interconnected by wire bonding. According to this aspect, a die-up flip chip ball grid array package, usually not molded, is provided, usually as an unsingulated strip of die-up flip chip ball grid array packages; preferably the BGA packages in the strip are tested for performance and reliability and packages identified as "good" are subjected to subsequent treatment; adhesive is dispensed over the upper surface of the substrate on "good" BGA packages; a second package is provided, which may in some embodiments be a stacked die package, optionally and usually molded; preferably the second package is tested and identified as "good"; the "good" second package is inverted and placed onto the adhesive over the BGA substrate, and the adhesive is cured; optionally and preferably a plasma clean operation is performed followed by formation of wire bond z-interconnections between the stacked top and bottom packages; optionally and preferably an additional plasma clean may be performed, followed by the formation of the MPM molding. Further steps include attachment of second-level interconnect solder balls to the underside of the module; testing and singulation of the completed module from the strip, for example by saw singulation or by punch singulation; and packaging for further use.

In another aspect the invention features a method for making a multi-package module including an inverted top package stacked over a stacked die bottom package, in which the top and bottom packages are electrically interconnected by wire bonding. According to this aspect, a stacked die BGA package, usually molded, is provided, usually as an unsingulated strip of stacked die ball grid array packages is provided; preferably the BGA packages in the strip are tested for performance and reliability and packages identified as "good" are subjected to subsequent treatment; adhesive is dispensed over the upper surface of the "good" stacked die BGA package, usually on the generally planar upper surface of the package molding; a singulated second package is provided, usually molded, which may optionally be a stacked die package; preferably the second package is tested and identified as "good"; the "good" second package is inverted and placed onto the adhesive over the upper surface of the BGA, and the adhesive is cured; optionally and preferably a plasma clean operation is performed followed by formation of wire bond z-interconnections between the stacked top and bottom packages; optionally and preferably an additional plasma clean may be performed, followed by the formation of the MPM molding. Further steps include attachment of second-level interconnect solder balls to the underside of the module; testing and singulation of the completed module from the strip, for example by saw singulation or by punch singulation; and packaging for further use.

In some embodiments of the method two or more first molded packages are provided in an unsingulated strip, and assembly of the two or more modules proceeds on the strip, and singulation of the two or more modules is carried out after assembly has been completed.

In methods according to the invention for making multi-package modules the electrical connections between the stacked packages employs conventional wire bonding to form the z-interconnect between the inverted top package substrate and a bottom package substrate in the stack. Particular advantages include the use of established manufacturing infrastructure, low production cost, design flexibility, and a thin package product. The wire bonding process may be carried out in either a "forward" or in a "reverse" manner. That is, the z-interconnect wire bonding can be carried out, in the various package and module configurations, by drawing the wire to a conductive pad on the first package substrate from a bump formed on a conductive pad on the second package substrate; or, by drawing the wire to a conductive pad on the second package substrate from a bump formed on a conductive pad on the first package substrate.

The invention provides for assembly of more than one semiconductor in a thin and minimal footprint package at the lowest cost and highest final test yield. Furthermore some stack configurations according to the invention allow for high thermal performance, high electrical performance or electrical isolation of an RF component from a digital one. Other stack configurations provide a very thin structure appropriate for handheld or consumer products. All provide for a method for assembly that allows individual testing of the stacked packages to maximize the final yield of the module.

Additional process steps will be employed to complete the multi-package module according to the invention. For example, it may be preferred not to attach solder balls for connection of the lowermost package in the stack to the motherboard until the final step before singulation of the MPMs. And, for example, a plasma clean may be performed at any of a variety of points in the process, such as following adhesive cure and prior to encapsulation, and such as prior to and/or following z-interconnect wire bonding.

Advantageously, the individual packages can be provided as strips of several packages, connected in a row for ease of handling during manufacture, to be singulated following completion of process steps. In methods according to the invention, a strip of first packages of a selected type can be kept nonsingulated, and the package stacks can be formed on the strip by affixing singulated packages and forming the wire bonded z-interconnects serially until the process of forming the modules is complete, and then singulating the modules.

MPM according to the invention can be used for building computers, telecommunications equipment, and consumer and industrial electronics devices.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the Figs. illustrating embodiments of the invention, elements corresponding to elements shown in other drawings are not all particularly relabeled, although they are all readily identifiable in all the Figs.

Figure 5A:
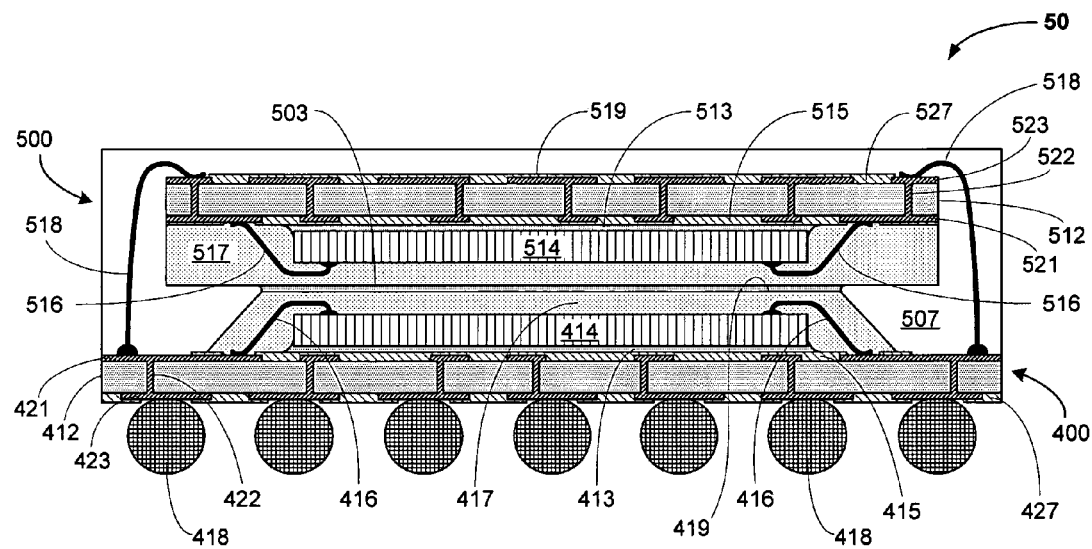
FIG. 5A is a diagrammatic sketch in a sectional view thru an embodiment of a multi-package module having wire bond z-interconnection between stacked lower BGA and inverted upper LGA semiconductor packages according to an aspect of the invention.

Turning now to FIG. 5A, there is shown in a diagrammatic sectional view generally at 50 an embodiment of a multi-package module, including stacked first ("bottom") and second ("top") packages, in which the top package is inverted, and the stacked packages are interconnected by wire bonding, according to an aspect of the invention. In the embodiment shown in FIG. 5A, the bottom package 400 is a conventional BGA package such as that shown in FIG. 1A. Accordingly, in this embodiment the bottom package 400 includes a die 414 attached onto a bottom package substrate 412 having at least one metal layer. Any of various substrate types may be used, including for example: a laminate with 2–6 metal layers, or a build up substrate with 4–8 metal layers, or a flexible polyimide tape with 1–2 metal layers, or a ceramic multilayer substrate. The bottom package substrate 412 shown by way of example in FIG. 5A has two metal layers 421, 423, each patterned to provide appropriate circuitry and connected by way of vias 422. The die is conventionally attached to a surface of the substrate using an adhesive, typically referred to as the die attach epoxy, shown at 413 in FIG. 5A and, in the configuration in FIG. 5A, the surface of the substrate onto which the die is attached may be referred to as the "upper" surface, and the metal layer on that surface may be referred to as the "upper" metal layer, although the die attach surface need not have any particular orientation in use.

In the bottom BGA package of FIG. 5A the die is wire bonded onto wire bond sites on the upper metal layer of the substrate to establish electrical connections. The die 414 and the wire bonds 416 are encapsulated with a molding compound 417 that provides protection from ambient and from mechanical stress to facilitate handling operations, and provides a bottom package upper surface 419 onto which a second ("top") package can be stacked. The connections to the die are exposed at the periphery of the package with pads on the top metal layer of the substrate and available for connecting with wire bonds as described in more detail below with reference to FIGS. 5B and 5C. These pads easily fit within the space available between the lower BGA mold cap and the edge of the package, without increasing the overall footprint of the BGA. The physical location and order of these pads is arranged so as to approximately lie under the equivalent pads on the LGA situated above. Solder balls 418 are reflowed onto bonding pads on the lower metal layer of the substrate to provide interconnection to underlying circuitry of, for example, a motherboard (not shown in the FIGS.) of a final product, such as a computer. Solder masks 415, 427 are patterned over the metal layers 421, 423 to expose the underlying metal at bonding sites for electrical connection, for example the wire bond sites and bonding pads for bonding the wire bonds 416 and solder balls 418.

Figure 1A:
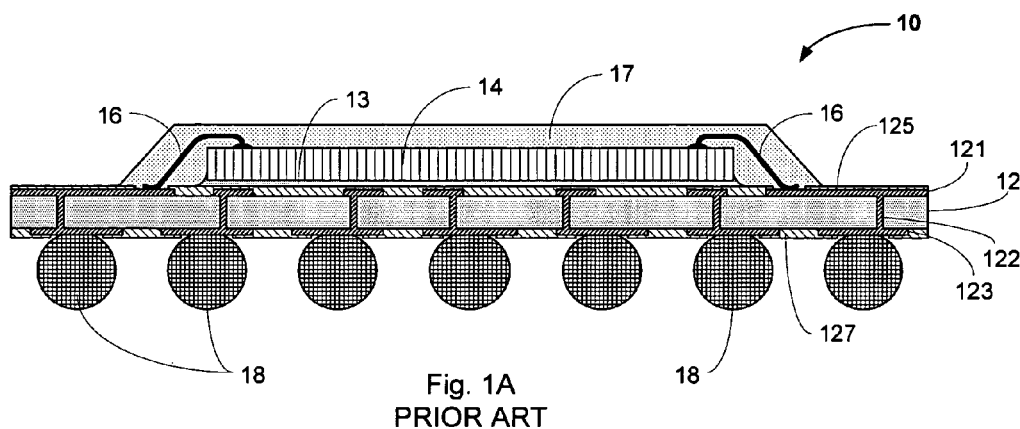
FIG. 1A is a diagrammatic sketch in a sectional view thru a conventional ball grid array semiconductor package.
Figure 1B:
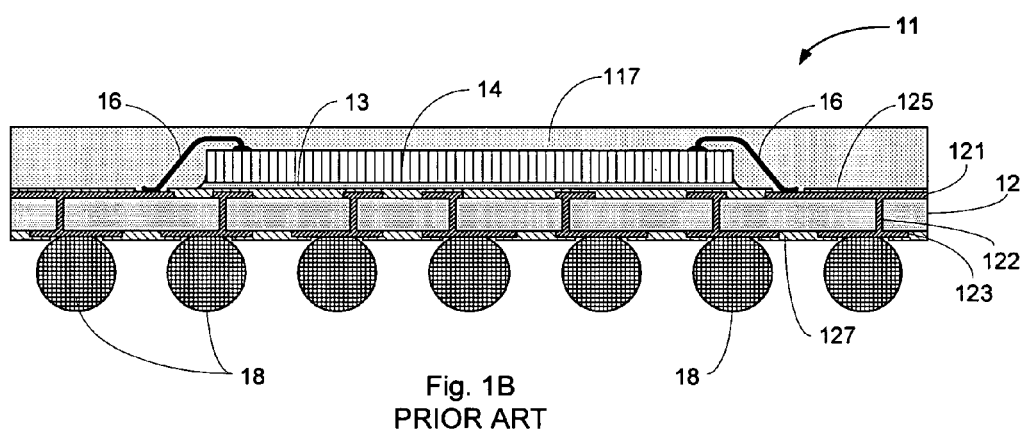
FIG. 1B is a diagrammatic sketch in a sectional view thru a conventional ball grid array semiconductor package having a molding cap over the entire substrate surface, as for example a chip scale package.

In the embodiment shown in FIG. 5A, the top package 500 is a land grid array ("LGA") package which may be a saw singulated LGA package, as shown for example in FIG. 1B, and may be a chip scale package; but here the top package has no solder balls mounted on bonding pads of the lower surface of the substrate. Particularly, in this example, the top package 500 includes a die 514 attached onto a top package substrate 512 having at least one metal layer. Any of various substrate types may be used; the top package substrate 512 shown by way of example in FIG. 5A has two metal layers 521, 523, each patterned to provide appropriate circuitry and connected by way of vias 522. The die is conventionally attached to a surface of the substrate using an adhesive, typically referred to as the die attach epoxy, shown at 513 in FIG. 5A. Referring again to FIGS. 1A and 1B, the die is referred to as being attached to an upper surface of the package substrate, it being appreciated that the package need not have any particular orientation in use. According to the invention, the top package is inverted, that is to say, it is attached upside downward and downside upward. Because the upper LGA is inverted in the module, so that it is relatively speaking upside-down or downside-up, the surface of the upper LGA to which the first die is attached, which would customarily be termed the upper surface or upper side of the LGA substrate, is referred to in the text herein as the downward or downward facing surface of the inverted LGA; and the opposite surface, which would customarily be termed the lower surface or lower side, is referred to in the text herein as the upward or upward facing surface.

In the configuration in FIG. 5A, for example, the surface of the top package substrate onto which the die is attached faces toward the bottom package, and, accordingly the "upper" surface of the top package, to which the die is affixed, is here referred to as the "downward facing" surface of the top package substrate, it being appreciated again that the module need not have any particular orientation in use. That is to say, once the top package has been inverted in the module according to the invention, for purposes of description the surface of the top package substrate having the "upper" metal layer 521 is said to be "downward facing", and the surface of the top package substrate having the "lower" metal layer 523 is said to be "upward facing".

In the top LGA package in the embodiment of FIG. 5A the die is wire bonded onto wire bond sites on the upper metal layer of the top package substrate to establish electrical connections. The die 514 and the wire bonds 516 are encapsulated with a molding compound 517 that provides protection from ambient and from mechanical stress to facilitate handling operations, and has a top package upper surface 519. The top package 500 is inverted (so that the surface 519 is "downward facing", and is stacked over the bottom package 400 and affixed there using an adhesive 513. Solder masks 515, 527 are patterned over the metal layers 521, 523 to expose the underlying metal at bonding sites for electrical connection, for example the wire bond sites for bonding the wire bonds 516.

The z-interconnect between the stacked top package 500 and bottom package 400 is made by way of wire bonds 518 connecting traces on the upward facing metal layer (the "lower" metal layer 523) of the top package substrate with traces on the upper metal layer 421 of the bottom package substrate. At one end each wire bond 518 is electrically connected to upward facing surfaces of pads on the lower metal layer 523 of the top package substrate 512, and at the other end each wire bond is connected to upper surfaces of pads on the upper metal layer 421 of the bottom package substrate 412. The wire bonds may be formed by any wire bonding technique, well known in the art, such as is described, for example, in U.S. Pat. No. 5,226,582, which is hereby incorporated by reference herein. The package-to-package z-interconnect wire bonds are shown by way of example in FIG. 5A as having been made by forming a bead or bump on the upper surface of a pad on the upper metal layer of the top substrate, and then drawing the wire downward toward and fusing it onto, a pad on the upper metal layer of the bottom substrate. As will be appreciated, the wire bonds can be made in the inverse direction, that is, by forming a bead or bump on the upper surface of a pad on the upper metal layer of the bottom substrate, and then drawing the wire upward toward and fusing it onto, a pad on the upper metal layer of the top substrate. As will be appreciated, selection of a wire bonding strategy for the package-to-package z-interconnection will be determined according to the geometric arrangements of the margins of the stacked substrates and of the bonding surfaces on them.

Figure 2:
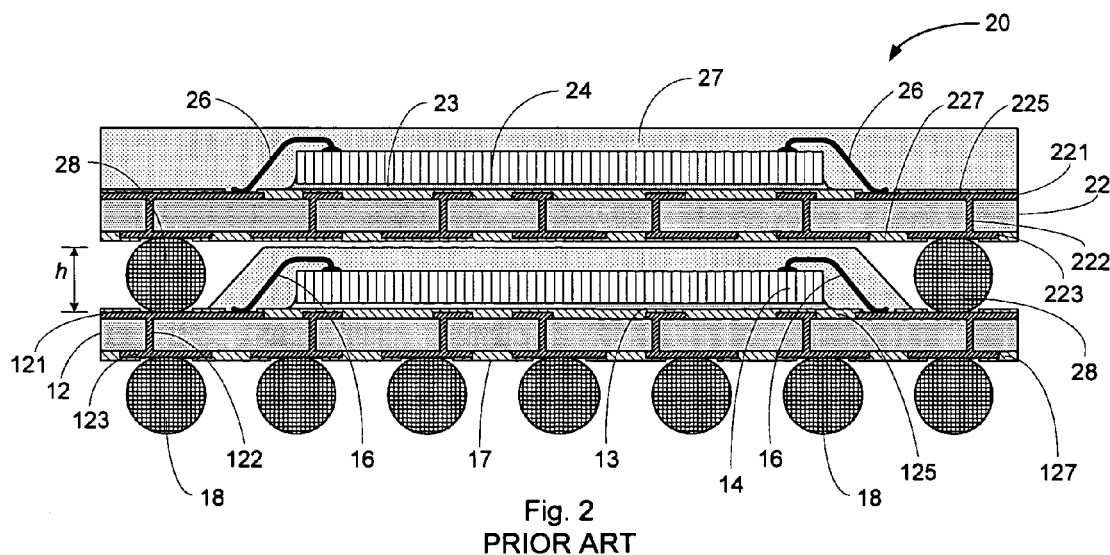
FIG. 2 is a diagrammatic sketch in a sectional view thru a conventional multi-package module having solder ball z-interconnection between stacked ball grid array semiconductor packages.
Figure 3:
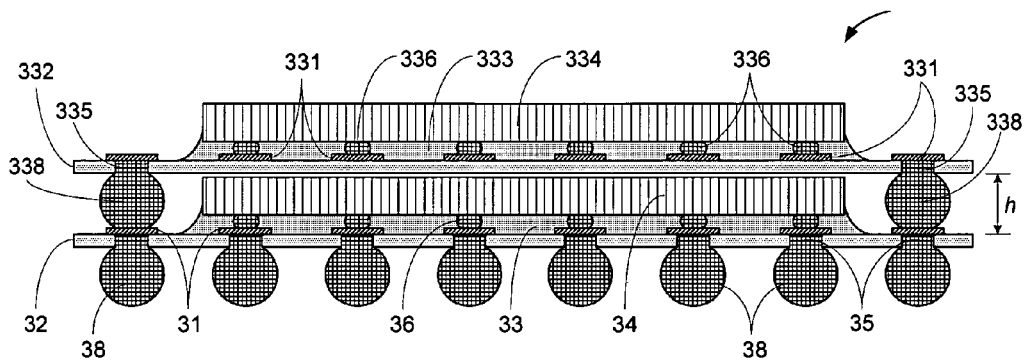
FIG. 3 is a diagrammatic sketch in a sectional view thru a conventional flip chip multi-package module having solder ball z-interconnection between stacked flip chip semiconductor packages.
Figure 4:
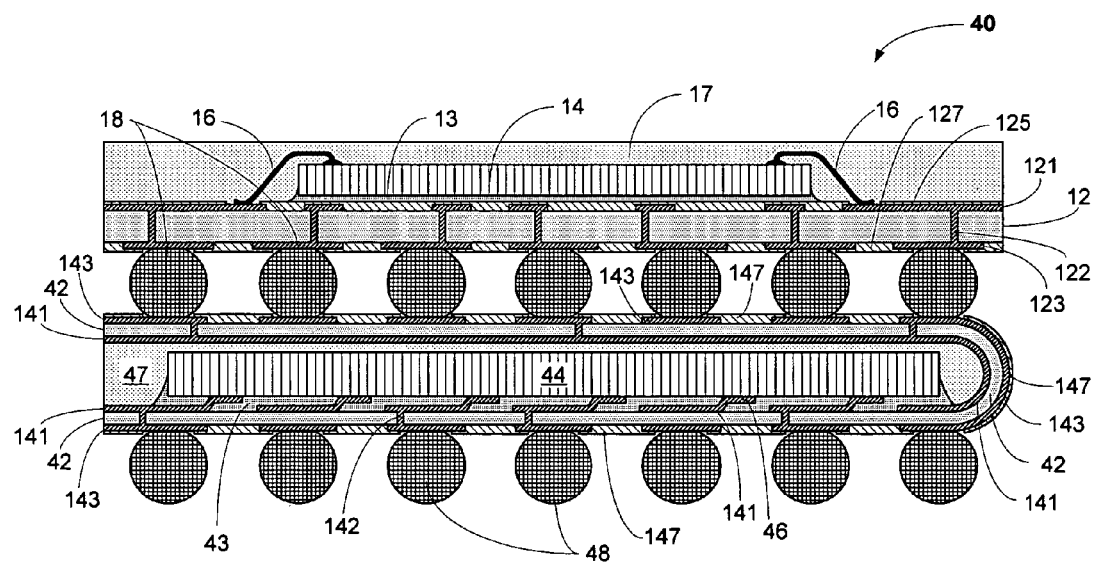
FIG. 4 is a diagrammatic sketch in a sectional view thru a conventional multi-package module having a folded flexible substrate and solder ball z-interconnection between stacked semiconductor packages.

The top LGA package may be either array molded and saw singulated (giving vertical walls at the edges, as shown for example in FIG. 1B and as the upper LGA in FIG. 2, or cavity molded and punch singulated. In either type, the top package has bond pads connected to the die (through vias to the die attach side of the substrate) and situated at the periphery of the package on the substrate surface opposite the surface on which the die is attached, that is, on the "lower" (upward-facing) side of the top package substrate, as described in further detail below with reference to FIG. 5C.

The structure according to the invention allows for pre-testing of both the BGA and LGA before assembly into the multi-package module, to permit rejection of nonconforming packages prior to assembly, and thereby to assure high final module test yields.

In the stacked package embodiment of FIG. 5A, the z-interconnect pads on the respective package substrates are arranged on upward facing metal layers near the margins of the package substrates. The location and order of the z-interconnect pads are generally arranged so that the z-interconnect pads on the top package substrate approximately overlie the corresponding z-interconnect pads on the bottom package when the packages are stacked. Conveniently, the top package 500 has a smaller substrate footprint than that of the bottom package 400, to allow clearance for the wire bonds without electrical shorting to the edges of the metal layers of the substrates. Once the z-interconnect wire bonds have been formed, a module encapsulation 507 is formed, to enclose and protect the z-interconnect wire bonds and to provide mechanical integrity to the completed module. Accordingly, the module includes molded packages within the module molding. As shown by way of example in FIG. 5A, the module may itself be saw-singulated; alternatively, the module may be individually molded rather than saw-singulated.

Figure 5D:
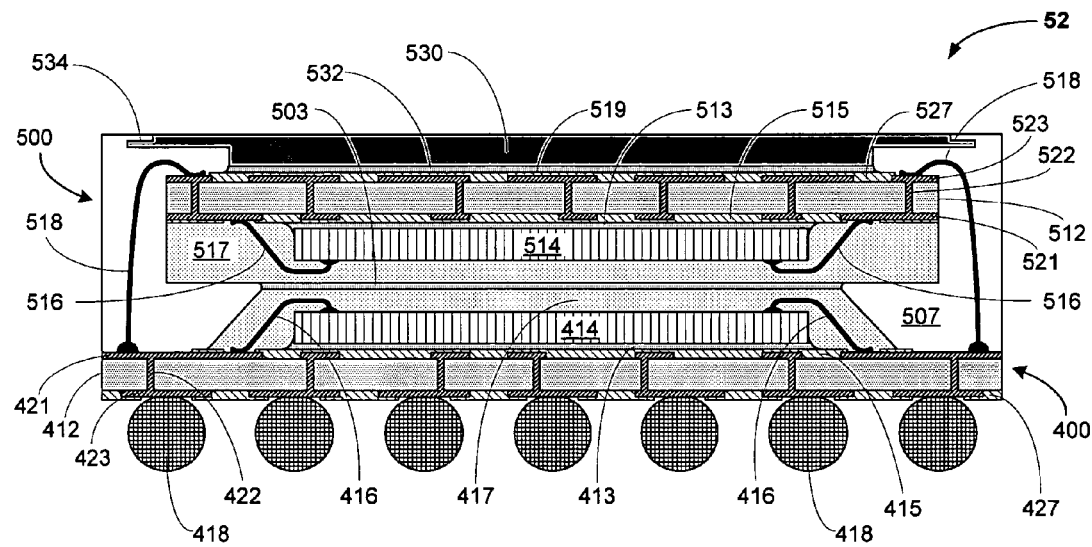
FIG. 5D is a diagrammatic sketch in a sectional view thru an embodiment of a multi-package module having wire bond z-interconnection between stacked lower BGA and inverted upper LGA semiconductor packages, having a heatspreader over the inverted LGA, according to an aspect of the invention.
Figure 5C:
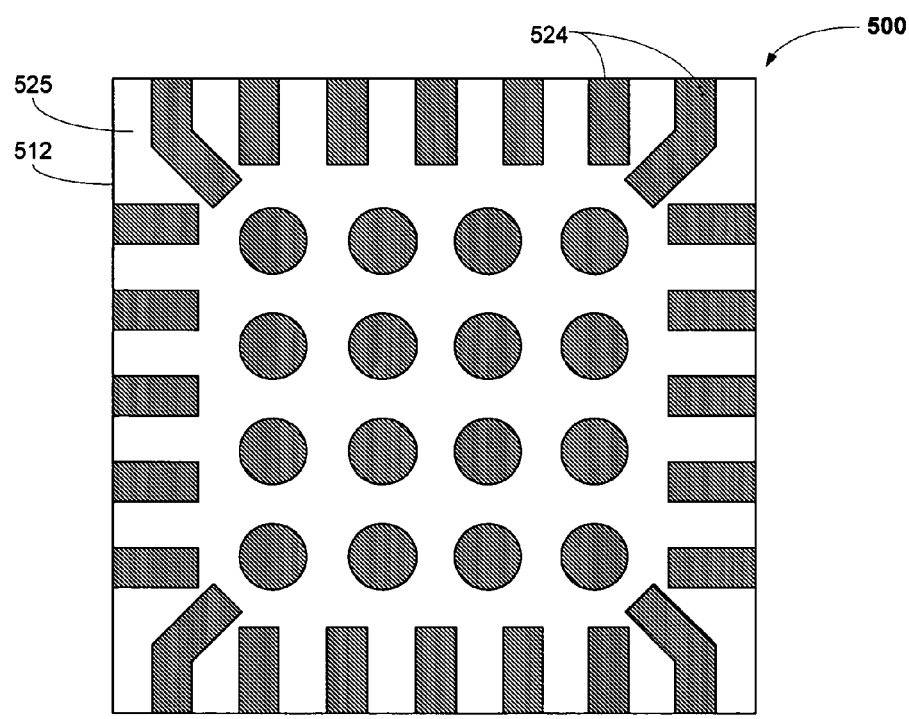
FIG. 5C is a sketch in a plan view showing top LGA z-interconnect bond pads in an arrangement suitable for use in an embodiment of the invention as shown in FIG. 5A.
Figure 5B:
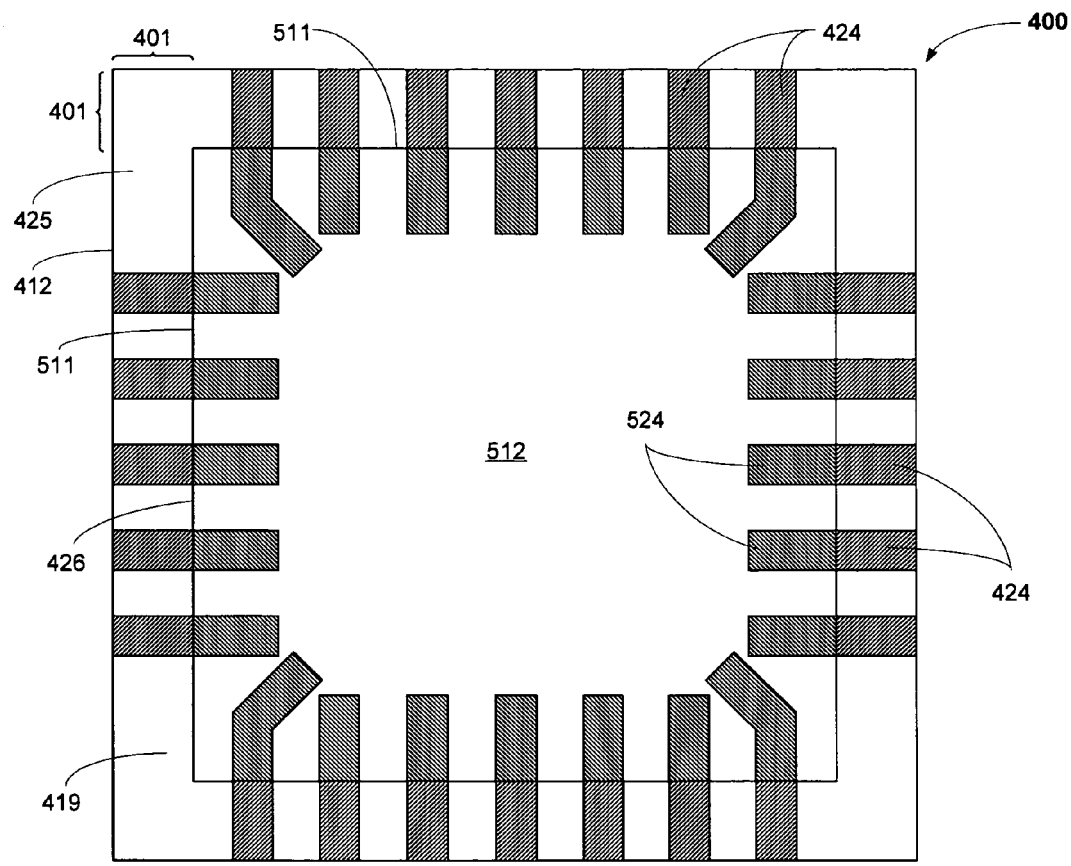
FIG. 5B is a sketch in a plan view showing bottom BGA z-interconnect bond pads in an arrangement suitable for use in an embodiment of the invention as shown in FIG. 5A.

The arrangements of the z-interconnect pads on the top and bottom package substrates are shown by way of example in diagrammatic plan view in FIGS. 5B and 5C, generally at 500 and 400, respectively. Referring to FIG. 5B, top package z-interconnect pads 524 are formed by patterning regions of the lower metal layer peripherally situated on the "lower" surface 525 of the top package substrate 512. As will be appreciated, when the top package is inverted, the "lower" substrate surface 525 becomes the upward-facing surface of the top package substrate, and the top package z-interconnect pads 524 are, accordingly, also upward-facing in the module. Also, as may be appreciated, the more centrally situated ball attach pads on the upward-facing side of the top package substrate are not necessary for z-interconnection and may be lacking in certain embodiments, depending upon the design of the top package. They are omitted, for illustrative purposes, from FIG. 5C.

Optionally, and in some applications preferably, the ball attach pads on the upward-facing side of the inverted top package substrate may be employed to facilitate testing of the LGA using a conventional test socket. Such testing of the LGA can be carried out prior to attaching the top LGA package into the bottom package, to ensure that only top LGAs testing as "good" are stacked over the bottom BGA packages (which may also be tested and identified as "good"). Or, testing of the LGA can be carried out following inversion of the LGA and attachment as a top package, but prior to formation of the overall module molding, or prior to z-interconnect wire-bonding. Testing, facilitated according to the constructs of the invention, at any of various stages in manufacture, can significantly reduce the likelihood of further processing of components that do not meet specifications.

Referring now to FIG. 5C, bottom package z-interconnect pads 424 are formed by patterning regions of the upper metal layer situated at the margin 401 on the upper surface 425 of the bottom package substrate 412. The margin 401 extends beyond the footprint 426 of the stacked and overlying top package, defined by the edge 511 of the top package substrate 512. The width of the margin 401 can be less about 1 mm, and, in order to provide adequate clearance for the wire bonding the width of the margin 401 may preferably be greater than about 0.2 mm. Nominally in some embodiments the margin 401 is about 0.5 mm. Where the module is saw-singulated, the margin constitutes approximately the clearance between the edge of the top package substrate and the side of the module molding.

The clearance between the z-interconnect wire bonds 518 and the upper surface of the module molding may preferably be about 75 µm or greater, to avoid impact between the molding machinery and the wire loops during molding formation; and the molding thickness over the upward-facing surface of the top package may preferably be greater than about 150 µm, to avoid formation of voids in the module molding. Where reverse wire bonding is employed, so that an end of the wire loop is stitched onto the pads on the upward facing side of the top package, the wire loop height in practice may be as little as about 75 µm and, accordingly, a molding thickness of as little as about 150 µm can be achieved in such embodiments. A greater mold height will be required where forward wire bonding is employed, as the wire loop height over a ball (or bump) as more usually about 125 µm or greater using currently available wire bonding techniques forming wire having about 1 mil thickness.

As will be apparent from FIGS. 5A, 5B and 5C, z-interconnection between the top and bottom packages according to the invention is made by wire bond between (either bond-up or bond-down) the top package interconnect pads 524 in the margin 501 of the top package substrate and the bottom package interconnect pads 424 in the margin 401 of the bottom package substrate. The multipackage module structure is protected by formation of a module encapsulant 507, and solder balls 418 are reflowed onto exposed solder ball pads on the lower metal layer of the bottom package substrate, for connection to underlying circuitry, such as a motherboard (not shown in the FIGS.).

The multi-package module of the invention can be employed in any of a diverse variety of applications, such as, for example, computers, portable communications devices, consumer products.

For improved heat dissipation from the multi-package module, a heat spreader may be provided over the top package. The top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper or aluminum) or of any of a variety of other thermally conductive materials, such as aluminum nitride. The heat spreader has a size and shape to substantially cover the package. The heat spreader can be made thicker in a central area over the top package to increase metal content, and thinner at the periphery so that it does not interfere with the z-interconnect wire bonds. If made thicker in a central area the heat spreader may be affixed to the upward facing surface of the top package. Or, a spacer may be placed over the upward facing surface of the package inboard of the wire bond sites, and the heat spreader may be affixed to the upper surface of the spacer. Alternately the heatspreader can be molded-in, resulting in a similar structure but without the adhesive; that is, the heat spreader may be dropped into the MPM encapsulant mold and affixed at the upper surface of the module during the molding material curing process. Or, the heatspreader may have a generally planar portion over the top package, and a peripheral supporting portion or supporting members resting on or near the upper surface of the bottom package substrate.

For example, a top heat spreader having a thicker central region can be affixed to the upward facing surface of the top package as shown diagrammatically in a sectional view in FIG. 5D. The construction of the stacked packages in MPM 52 is generally similar to that of MPM 50 in FIG. 5A, and like structures are identified in the FIGS. by like reference numerals. The top heat spreader 530 in the example of FIG. 5D is a generally planar piece of a thermally conductive material having at least the more central area of its planar upper surface exposed to ambient for efficient heat exchange away from the MPM. The top heat spreader 530 has a thicker central portion, inboard of the wire bond sites on the top package, and the thicker portion is affixed to the upward facing side 519 of the top package using an adhesive 532. The thickness of the heat spreader may in some embodiments be in the range 0.2 to 0.6 mm, nominally 0.4 mm. The top heat spreader may be, for example, constructed of metal (such as copper, or aluminum). Where the top heat spreader is made of copper, the lower surface is preferably treated to have a black oxide, for improved adhesion to the attachment material beneath; the exposed upper surface may be treated to form a black oxide, or it may be provided with a matte nickel (plate) surface. The adhesive 532 may optionally be a thermally conductive adhesive, such as a thermally conductive epoxy, to provide improved heat dissipation; and the adhesive may be electrically nonconductive, in embodiments having exposed electrical features on the upward facing ("lower") side. Usually the top heat spreader is affixed to the top package before the molding material is injected for the MPM encapsulation 507. The periphery of the top heat spreader may be encapsulated with the MPM molding material. In the embodiment of FIG. 5D a step like re-entrant feature 534 is provided on the periphery of the heat spreader 530 to allow for better mechanical integrity of the structure with less delamination from the molding compound.

As a further alternative, an MPM as in FIG. 5A can be provided with a top heat formed of a thermally conductive material having a generally planar central portion situated over the top package, and peripheral supporting members extending from near the edges or the corners of the generally planar central portion to the upper surface of the bottom package substrate 412, outside the z-interconnect bond pads and near the edge of bottom package. The upper surface of the planar portion is exposed to ambient at the MPM upper surface for efficient heat exchange away from the MPM. The top heat spreader may be formed, for example, of a sheet of metal (such as copper), for example by stamping. The supporting members can optionally be affixed to the upper surface of the bottom package substrate using an adhesive. The heat spreader supporting members are embedded in the MPM encapsulant 507 during the molding material curing process. As in the embodiment of FIG. 5D a step like re-entrant feature can be provided on the periphery of the planar upper portion of the heat spreader to allow for better mechanical integrity of the structure with less delamination from the molding compound. In this embodiment the space between the lower surface of the planar central portion of the heat spreader and the upward facing surface 519 of the top package is filled by a thin layer of the MPM molding.

As a further alternative, an MPM as in FIG. 5A can be provided with a simple planar heat spreader, with no supporting members, that is not attached to the upper surface of the top package molding. In such embodiments, as in the embodiment of FIG. 5D, the top heat spreader can be a generally planar piece of a thermally conductive material such as, for example, a sheet of metal (such as copper or aluminum), and at least the more central area of the upper surface of the planar heat spreader is exposed to ambient for efficient heat exchange away from the MPM. Here, the heat spreader does not have a thicker central portion inboard of the wire bond sites on the upper package; instead, the space between the lower surface of the simple planar heat spreader and the upper surface 519 of the top package may be filled by a thin layer of the MPM molding, and such a simple planar heat spreader may be affixed to the MPM encapsulant 507 during the molding material curing process. The periphery of such an unattached simple planar top heat spreader can be encapsulated with the MPM molding material, as in the attached planar heat spreader of FIG. 5D, and may be provided with a step-like re-entrant feature on the periphery to allow for better mechanical integrity of the structure with less delamination from the molding compound.

An MPM structure having a heat spreader, as in FIG. 5D, or in the alternative embodiments described above, can provide significant thermal enhancement and may provide electrical shielding over the module, which can be critical to MPMs that combine RF and digital chips.

Figure 6A:
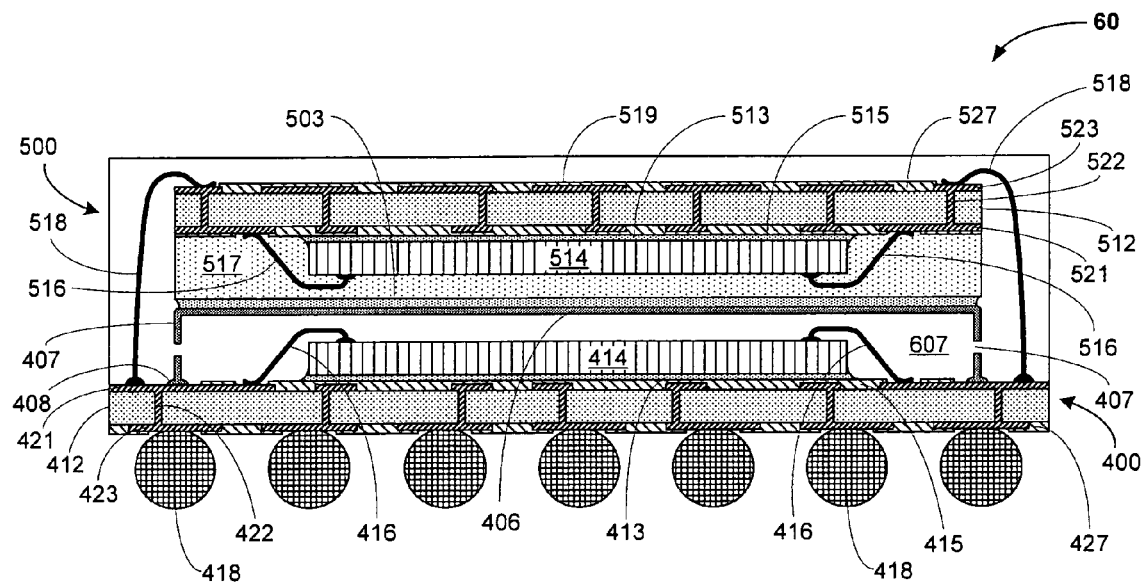
FIG. 6A is a diagrammatic sketch in a sectional view thru an embodiment of a multi-package module having wire bond z-interconnection between stacked lower BGA and inverted upper LGA semiconductor packages, and having an electrical shield/heatspreader over the lower BGA and between the lower BGA and the inverted upper LGA, according to a further aspect of the invention.

FIG. 6A is a diagrammatic sketch in a sectional view showing an inverted top LGA package stacked over a BGA package in an MPM 60 according to another aspect of the invention, in which a heat spreader/electrical shield is provided to the bottom package. The embodiment shown by way of example in FIG. 6A has a top land grid array ("LGA") package 500 inverted and stacked over a bottom ball grid array ("BGA") package 400, in which the inverted top LGA package is constructed generally as is the top LGA package in FIG. 5A. Referring to FIG. 6A, the top LGA package 500 may be similar to a BGA package, as shown for example in FIG. 1A, but having no solder balls mounted on bonding pads of the lower surface of the substrate. Particularly, in this example, the top package 500 includes a die 514 attached onto a top package substrate 512. Any of various substrate types may be used; the top package substrate 512 shown by way of example in FIG. 6A has two metal layers 521, 523, each patterned to provide appropriate circuitry and connected by way of vias 522. The die is conventionally attached to a surface of the substrate using an adhesive, typically referred to as the die attach epoxy, shown at 513 in FIG. 6A and, in the configuration in FIG. 6A, the surface of the substrate onto which the die is attached may be referred to as the "upper" surface, and the metal layer on that surface may be referred to as the "upper" metal layer, although the die attach surface need not have any particular orientation in use, and, for purposes of description the die attach side of the top package substrate is the downward facing side when the top package is inverted in the multi-package module according to the invention.

In the top LGA package in the embodiment of FIG. 6A the die is wire bonded onto wire bond sites on the upper metal layer of the substrate to establish electrical connections. The die 514 and the wire bonds 516 are encapsulated with a molding compound 517 that provides protection from ambient and from mechanical stress to facilitate handling operations, and has a top package molding surface. In the inverted orientation the top package molding surface is downward facing. Solder masks 515, 527 are patterned over the metal layers 521, 523 to expose the underlying metal at bonding sites for electrical connection, for example the wire bond sites for bonding the wire bonds 516. In its inverted orientation in the multi-package module, the top package has an upward facing surface 519.

The bottom BGA package 400 in the embodiment of FIG. 6A is a conventional BGA package such as that shown in FIG. 1A, except that the bottom BGA package of FIG. 6A is not encapsulated with a molding compound; rather, it is provided with a heat spreader that can additionally act as an electrical shield, as described below. Accordingly, in this embodiment the bottom package 400 includes a die 414 attached onto a bottom package substrate 412 having at least one metal layer. Any of various substrate types may be used, including for example: a laminate with 2–6 metal layers, or a build up substrate with 4–8 metal layers, or a flexible polyimide tape with 1–2 metal layers, or a ceramic multi-layer substrate. The bottom package substrate 412 shown by way of example in FIG. 6A has two metal layers 421, 423, each patterned to provide appropriate circuitry and connected by way of vias 422. The die is conventionally attached to a surface of the substrate using an adhesive, typically referred to as the die attach epoxy, shown at 413 in FIG. 6A and, in the configuration in FIG. 6A, the surface of the substrate onto which the die is attached may be referred to as the "upper" surface, and the metal layer on that surface may be referred to as the "upper" metal layer, although the die attach surface need not have any particular orientation in use.

In the bottom BGA package of FIG. 6A the die is wire bonded onto wire bond sites on the upper metal layer of the substrate to establish electrical connections. Solder balls 418 are reflowed onto bonding pads on the lower metal layer of the substrate to provide interconnection to underlying circuitry of, for example, a printed circuit board (not shown in the FIGS.) of a final product, such as a computer. Solder masks 415, 427 are patterned over the metal layers 421, 423 to expose the underlying metal at bonding sites for electrical connection, for example the wire bond sites and bonding pads for bonding the wire bonds 416 and solder balls 418.

The bottom BGA package 400 of multipackage module 60 is provided with a metallic (for example, copper) heat spreader that acts additionally as an electrical shield to electrically contain any electromagnetic radiation from the die in the lower BGA and thereby prevent interference with the die in the upper package. An "upper" planar part of the heat spreader 406 is supported above the substrate 412 and over the die 414 by legs or vented sidewalls 407. Spots or lines 408 of an adhesive serve to affix the heat spreader support 407 to the upper surface of the bottom substrate. The adhesive can be a conductive adhesive, and can be electrically connected to the top metal layer 421 of the substrate 412, particularly to a ground plane of the circuit and thereby establishing the heat spreader as an electrical shield. To provide good shielding, the electric shield is constructed of a highly electrically conductive material, usually a metal such as aluminum or copper. Where it is copper, the copper surface is preferably treated to provide a black oxide surface, or is provided with a nickel plating, to improve adhesion. Or, the adhesive can be non-conductive and in such a configuration the heat spreader acts only as a heat spreading device. The supporting parts and the top part of the heat spreader 406 enclose the die 414 and the wire bonds 416, and can serve to protect those structures from ambient and from mechanical stress to facilitate handling operations and, particularly, during subsequent testing before the MPM assembly. Accordingly, no separate bottom package molding is necessary in such embodiments (the MPM molding, fills in later), making for decreased manufacturing cost.

The top package 500 of multipackage module 60 is stacked over the bottom package 400 upon the planar surface of the heat spreader/shield 406 and affixed there using an adhesive 503. The adhesive 503 can be thermally conductive, to improve thermal dissipation.

The z-interconnection between the top package 500 and the bottom package 400 according to the invention is made by wire bonds 518 between top package interconnect pads in the margin of the top package substrate 512 and bottom package interconnect pads in the margin of the bottom package substrate 400. The wire bonds may be formed in either up-bond or down-bond (forward or reverse bond) fashion. The multipackage module structure is protected by formation of a module encapsulant 607. Openings (vents) may be provided in the supporting parts 407 of the heat spreader to allow the MPM molding material to fill in the enclosed space during encapsulation.

Solder balls 418 are reflowed onto exposed solder ball pads on the lower metal layer of the bottom package substrate 412, for connection to underlying circuitry, such as a printed circuit board (not shown in the FIGS.) such as a motherboard.

Multi-package modules according to this aspect of the invention, in which an electric shield is provided over the bottom package, can be particularly useful in radio-frequency devices, as for example in communications equipment. In applications having digital and RF semiconductor chips, the electronic shield can provide noise reduction by suppressing RF interference either to or from the shielded die. This can be particularly useful for example where the bottom package semiconductor die is a radio-frequency device, as for example in communications equipment, to prevent electromagnetic interference between the RF die and the upper package.

As will be appreciated from the foregoing, the structure according to the invention allows for pre-testing of both the BGA and LGA before assembly into the multi-package module, to permit rejection of nonconforming packages prior to assembly, and thereby to assure high final module test yields.

For improved heat dissipation from the multi-package module, a top heat spreader may be provided over the top package in addition to the heat spreader/electrical shield over the bottom package as in FIG. 6A. The top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper or aluminum) or of any of a variety of other thermally conductive materials, such as aluminum nitride. The heat spreader has a size and shape to substantially cover the package. The heat spreader can be made thicker in a central area over the top package to increase metal content, and thinner at the periphery so that it does not interfere with the z-interconnect wire bonds. If made thicker in a central area the heat spreader may be affixed to the upward facing surface of the top package. Or, a spacer may be placed over the upward facing surface of the package inboard of the wire bond sites, and the heat spreader may be affixed to the upper surface of the spacer. Alternately the heatspreader can be molded-in, resulting in a similar structure but without the adhesive; that is, the heat spreader may be dropped into the MPM encapsulant mold and affixed at the upper surface of the module during the molding material curing process. Or, the heatspreader may have a generally planar portion over the top package, and a peripheral supporting portion or supporting members resting on or near the upper surface of the bottom package substrate.

Figure 6B:
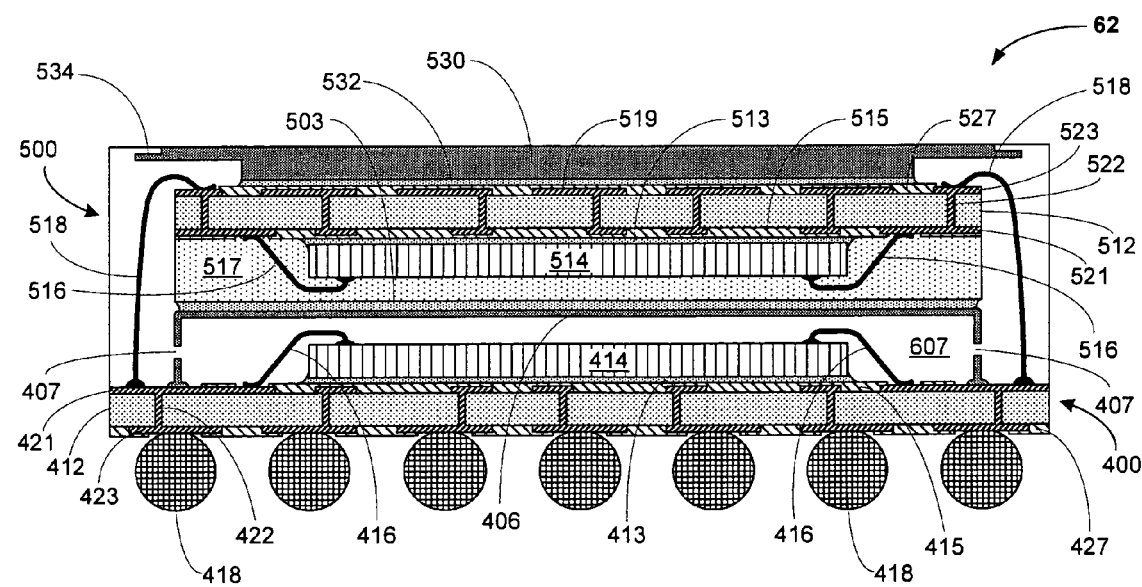
FIG. 6B is a diagrammatic sketch in a sectional view thru an embodiment of a multi-package module having wire bond z-interconnection between stacked lower BGA and inverted upper LGA semiconductor packages, and having an electrical shield/heatspreader over the lower BGA and between the lower BGA and the inverted upper LGA as in FIG. 6A, and further having a heatspreader over the inverted LGA, according to a further aspect of the invention.

For example, a top heat spreader having a thicker central region can be affixed to the upward facing surface of the top package as shown diagrammatically in a sectional view in FIG. 6B. The construction of the stacked packages in MPM 62 is generally similar to that of MPM 60 in FIG. 6A, and like structures are identified in the FIGS. by like reference numerals. The top heat spreader 530 in the example of FIG. 6B is a generally planar piece of a thermally conductive material having at least the more central area of its planar upper surface exposed to ambient for efficient heat exchange away from the MPM. The top heat spreader 530 has a thicker central portion, inboard of the wire bond sites on the top package, and the thicker portion is affixed to the upward facing side 519 of the top package using an adhesive 532. The thickness of the heat spreader may in some embodiments be in the range 0.2 to 0.6 mm, nominally 0.4 mm. The top heat spreader may be, for example, constructed of metal (such as copper, or aluminum). Where the top heat spreader is made of copper, the lower surface is preferably treated to have a black oxide, for improved adhesion to the attachment material beneath; the exposed upper surface may be treated to form a black oxide, or it may be provided with a matte nickel (plate) surface. The adhesive 532 may optionally be a thermally conductive adhesive, such as a thermally conductive epoxy, to provide improved heat dissipation; and the adhesive may be electrically nonconductive, in embodiments having exposed electrical features on the upward facing ("lower") side. Usually the top heat spreader is affixed to the top package before the molding material is injected for the MPM encapsulation 607. The periphery of the top heat spreader may be encapsulated with the MPM molding material. In the embodiment of FIG. 6B a step like re-entrant feature 534 is provided on the periphery of the heat spreader 530 to allow for better mechanical integrity of the structure with less delamination from the molding compound.

As a further alternative, an MPM as in FIG. 6A can be provided with a top heat formed of a thermally conductive material having a generally planar central portion situated over the top package, and peripheral supporting members extending from near the edges or the corners of the generally planar central portion to the upper surface of the bottom package substrate 412, outside the z-interconnect bond pads and near the edge of bottom package. The upper surface of the planar portion is exposed to ambient at the MPM upper surface for efficient heat exchange away from the MPM. The top heat spreader may be formed, for example, of a sheet of metal (such as copper), for example by stamping. The supporting members can optionally be affixed to the upper surface of the bottom package substrate using an adhesive. The heat spreader supporting members are embedded in the MPM encapsulant 607 during the molding material curing process. As in the embodiment of FIG. 6B a step like re-entrant feature can be provided on the periphery of the planar upper portion of the heat spreader to allow for better mechanical integrity of the structure with less delamination from the molding compound. In this embodiment the space between the lower surface of the planar central portion of the heat spreader and the upward facing surface 519 of the top package is filled by a thin layer of the MPM molding.

As a further alternative, an MPM as in FIG. 6A can be provided with a simple planar heat spreader, with no supporting members, that is not attached to the upper surface of the top package molding. In such embodiments, as in the embodiment of FIG. 6B, the top heat spreader can be a generally planar piece of a thermally conductive material such as, for example, a sheet of metal (such as copper or aluminum), and at least the more central area of the upper surface of the planar heat spreader is exposed to ambient for efficient heat exchange away from the MPM. Here, the heat spreader does not have a thicker central portion inboard of the wire bond sites on the upper package; instead, the space between the lower surface of the simple planar heat spreader and the upper surface 519 of the top package may be filled by a thin layer of the MPM molding, and such a simple planar heat spreader may be affixed to the MPM encapsulant 607 during the molding material curing process. The periphery of such an unattached simple planar top heat spreader can be encapsulated with the MPM molding material, as in the attached planar heat spreader of FIG. 5D, and may be provided with a step-like re-entrant feature on the periphery to allow for better mechanical integrity of the structure with less delamination from the molding compound.

An MPM structure having a heat spreader, as in FIG. 6B, or in the alternative embodiments described above, can provide significant thermal enhancement and may provide electrical shielding over the module, which can be critical to MPMs that combine RF and digital chips.

An advantage of a structure as in FIGS. 5D, 6A, 6B is significant thermal performance and, optionally, electrical shielding at the bottom package, which can be particularly important critical, for example, in MPM that combine RF and digital chips. It is not necessary to have both a bottom package heat spreader and a top heat spreader for all applications. Alternately one or the other may be adequate depending on the end product needs.

As may be appreciated, either or both of the packages may have flip chip, rather than wire bonding, interconnection of the die to the respective package substrates, but according to the invention the top package is inverted, and z-interconnection between the top and bottom substrates is by wire bonding.

In some modules having flip chip interconnection of the bottom package die to the bottom package substrate, for example, the die in the bottom BGA may be interconnected with the bottom BGA substrate by flip-chip interconnect in a "die down" configuration. No separate molding is required for the lower BGA package in this configuration; a matrix mold saw-singulated molding encapsulates the upper LGA package, and an MPM molding encapsulates the stacked packages in the completed multi-package module.

Figure 7A:
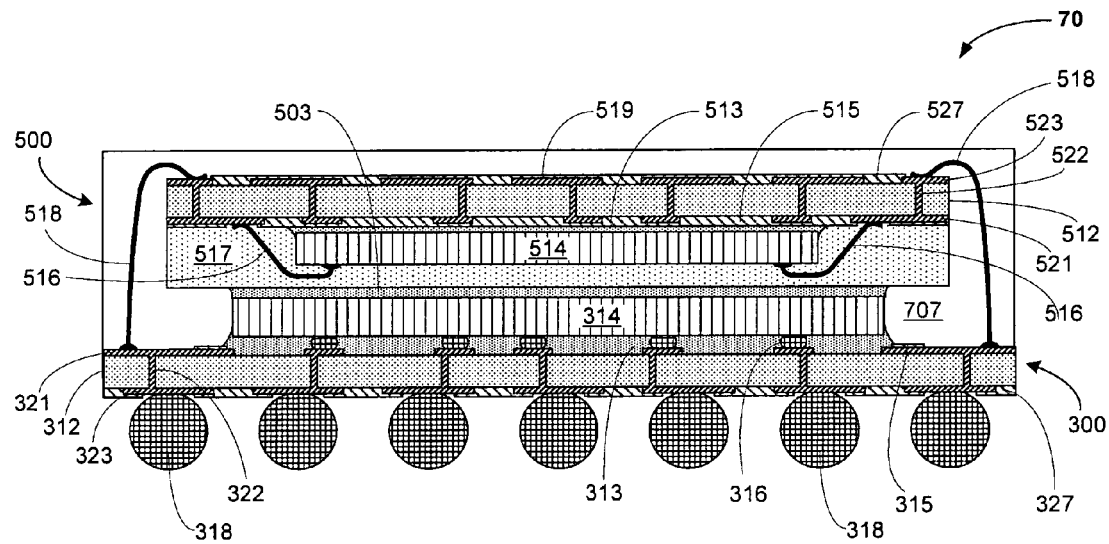
FIG. 7A is a diagrammatic sketch in a sectional view thru an embodiment of a multi-package module having wire bond z-interconnection between stacked bottom flip chip (die down) BGA and inverted top LGA semiconductor packages according to a further aspect of the invention.

FIG. 7A is a diagrammatic sketch in a sectional view showing a multi-package module 70 according to another aspect of the invention, in which an inverted top package is stacked over a flip chip BGA with die down. In the lower BGA the die is flip chip connected to the substrate and the space between the die and the substrate is underfilled. This BGA can be tested before assembly into the MPM. The back of the die is available to attach the inverted top LGA with adhesive. The z-interconnect of the top LGA to the module substrate is via wire bonding and the MPM is molded. A primary advantage of this configuration is that the flip chip connection on the BGA provides for high electrical performance.

Referring to FIG. 7A, the bottom BGA flip chip package includes a substrate 412 having a patterned metal layer 321 onto which the die 314 is connected by flip chip bumps 316, such as solder bumps, gold stud bumps or anisotropically conducting film or paste. Any of various substrate types may be used; the bottom package substrate 312 shown by way of example in FIG. 7A has two metal layers 321, 323, each patterned to provide appropriate circuitry and connected by way of vias 322. The flip chip bumps are affixed to a patterned array of bump pads on the active surface of the die and, as the active surface of the die faces downward in relation to an upward-facing patterned metal layer of the substrate, such an arrangement may be referred to as a "die down" flip chip package. A polymer underfill 313 between die and substrate provides protection from ambient and adds mechanical integrity to the structure.

The top LGA package 500 of multipackage module 70 is constructed generally similarly to the top LGA package 500 of the multipackage module 50 of FIG. 5A. Particularly, the top package 500 includes a die 514 attached onto a top package substrate 512. Any of various substrate types may be used; the top package substrate 512 shown by way of example in FIG. 7A has two metal layers 521, 523, each patterned to provide appropriate circuitry and connected by way of vias 522. The die is conventionally attached to a surface of the substrate using an adhesive, typically referred to as the die attach epoxy, shown at 513 in FIG. 7A and, in the configuration in FIG. 7A, the surface of the substrate onto which the die is attached may be referred to as the "upper" surface, and the metal layer on that surface may be referred to as the "upper" metal layer, although the die attach surface need not have any particular orientation in use, and, for purposes of description the die attach side of the upper package substrate is the downward facing side when the top package is inverted in the multi-package module according to the invention.

In the top LGA package 500 in the embodiment of FIG. 7A the die is wire bonded onto wire bond sites on the upper metal layer of the substrate to establish electrical connections. The die 514 and the wire bonds 516 are encapsulated with a molding compound 517 that provides protection from ambient and from mechanical stress to facilitate handling operations, and has a top package molding surface. In the inverted orientation the top package molding surface is downward facing. Solder masks 515, 527 are patterned over the metal layers 521, 523 to expose the underlying metal at bonding sites for electrical connection, for example the wire bond sites for bonding the wire bonds 516. In its inverted orientation in the multi-package module, the top package has an upward facing ("lower") surface 519.

The top package 500 is stacked over the bottom package 300 and affixed there using an adhesive, indicated at 503.

The z-interconnect between the stacked top package 500 and bottom package 300 is made by way of wire bonds 518 connecting the upward-facing metal layers of the respective package substrates. The multipackage module structure is protected by formation of a module encapsulant 707, and solder balls 318 are reflowed onto exposed solder ball pads on the lower metal layer of the bottom package substrate, for connection to underlying circuitry, such as a motherboard (not shown in the FIGS.) of a final product, such as a computer. Solder masks 315, 327 are patterned over the metal layers 321, 323 to expose the underlying metal at bonding sites for electrical connection, for example the wire bond sites and bonding pads for bonding the wire bonds 518 and solder balls 318.

Structures having a LGA stacked over a flip chip BGA with die down as described for example with reference to FIG. 7A can be assembled with a heat spreader/electrical shield much as shown in FIG. 6A or FIG. 6B. Accordingly, FIG. 7B is a diagrammatic sketch in a sectional view showing a multi-package module according to another aspect of the invention, in which an inverted LGA is stacked over a flip chip BGA with die down, as in the embodiment of FIG. 7A, and in which the lower BGA is provided with a heat spreader/shield.

Figure 7B:
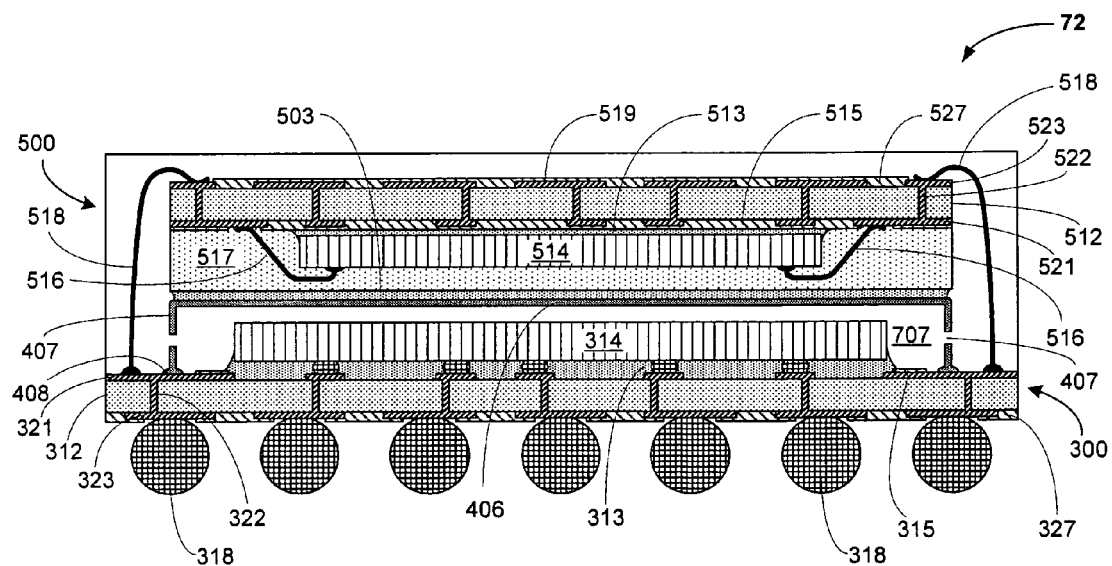
FIG. 7B is a diagrammatic sketch in a sectional view thru an embodiment of a multi-package module having wire bond z-interconnection between stacked bottom flip chip (die down) BGA and inverted top LGA semiconductor packages according to a further aspect of the invention, the bottom package being provided with an electromagnetic shield/heat spreader.

Particularly, referring to FIG. 7B, the bottom BGA package 300 of multipackage module 72 is provided with a metallic (for example, copper) heat spreader that acts additionally as an electrical shield to electrically contain any electromagnetic radiation from the die in the lower BGA and thereby prevent interference with the die in the upper package. An upper planar part of the heat spreader 406 is supported above the substrate 312 and over the die 314 by legs or sidewalls 407. Spots or lines 408 of an adhesive serve to affix the heat spreader support 406 to the upper surface of the bottom substrate. The adhesive can be a conductive adhesive, and can be electrically connected to the top metal layer 321 of the substrate 312, particularly to a ground plane of the circuit and thereby establishing the heat spreader as an electrical shield. Or, the adhesive can be non-conductive and in such a configuration the heat spreader acts only as a heat spreading device. The supporting parts and the top part of the heat spreader 406 enclose the die 314, and can serve for protection from ambient and from mechanical stress to facilitate handling operations and, particularly, during subsequent testing before the MPM assembly.

The top package 500 of multipackage module 72 is stacked over the bottom package 300 upon the planar surface of the heat spreader/shield 406 and affixed there using an adhesive 503. The adhesive 503 can be thermally conductive, to improve thermal dissipation; and the adhesive 503 can be electrically conductive, to establish electrical connection of the heat spreader 406 to a lower metal layer of the LGA package substrate, or it can be electrically insulating, thereby preventing electrical connection.

The z-interconnection between the top package 500 and the bottom package 300 according to the invention is made by wire bonds 518 between top package interconnect pads in the margin of the top package substrate 512 and bottom package interconnect pads in the margin of the bottom package substrate 300. The wire bonds may be formed in either up-bond or down-bond (forward or reverse bonding) fashion. The multipackage module structure is protected by formation of a module encapsulant 707. Openings may be provided in the supporting parts 407 of the heat spreader to allow the MPM molding material to fill in the enclosed space during encapsulation.

Solder balls 318 are reflowed onto exposed solder ball pads on the lower metal layer of the bottom package substrate 300, for connection to underlying circuitry, such as a printed circuit board (not shown in the FIGS.).

As will be appreciated from the foregoing, the structure according to the invention allows for pre-testing of both the BGA and LGA before assembly into the multi-package module, to permit rejection of nonconforming packages prior to assembly, and thereby to assure high final module test yields.

The processor chip in a flip chip bottom package according to this aspect of the invention can be, for example, an ASIC, or a GPU, or a CPU, often an ASIC; and the top package can be, for example, a processor chip or, for example, a memory package or an ASIC package. Where the top package is a memory package it can be a stacked die memory package. A shielded flip chip die-down bottom package can be particularly suitable for higher speed applications, particularly for RF frequency processing, as in mobile communications applications.

Optionally, for improved heat dissipation from the multi-package module, a MPM having a flip chip bottom package in a die-down configuration (as shown for example in FIG. 7A or FIG. 7B) may be further provided with a top heat spreader over the top package in addition to the heat spreader/electrical shield over the bottom package as in FIG. 7B. The optional top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper or aluminum) or of any of a variety of other thermally conductive materials, such as aluminum nitride. The heat spreader has a size and shape to substantially cover the package. The heat spreader can be made thicker in a central area over the top package to increase metal content, and thinner at the periphery so that it does not interfere with the z-interconnect wire bonds. If made thicker in a central area the heat spreader may be affixed to the upward facing surface of the top package. Or, a spacer may be placed over the upward facing surface of the package inboard of the wire bond sites, and the heat spreader may be affixed to the upper surface of the spacer. Alternately the heatspreader can be molded-in, resulting in a similar structure but without the adhesive; that is, the heat spreader may be dropped into the MPM encapsulant mold and affixed at the upper surface of the module during the molding material curing process. Or, the heatspreader may have a generally planar portion over the top package, and a peripheral supporting portion or supporting members resting on or near the upper surface of the bottom package substrate.

Figure 7C:
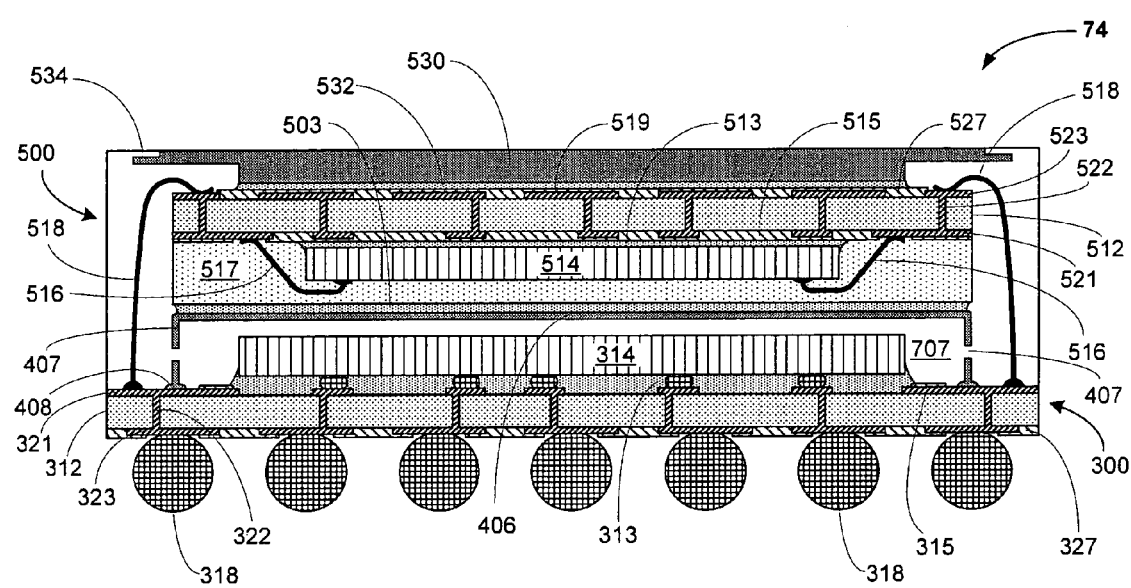
FIG. 7C is a diagrammatic sketch in a sectional view thru an embodiment of a multi-package module having wire bond z-interconnection between stacked lower flip chip (die down) BGA and inverted upper LGA semiconductor packages according to a further aspect of the invention, the bottom package being provided with an electromagnetic shield/heat spreader, and the module being further provided with a top heat spreader.

For example, a top heat spreader having a thicker central region can be affixed to the upward facing surface of the top package as shown diagrammatically in a sectional view in FIG. 7C. The construction of the stacked packages in MPM 74 is generally similar to that of MPM 72 in FIG. 7B, and like structures are identified in the FIGS. by like reference numerals. The top heat spreader 530 in the example of FIG. 7C is a generally planar piece of a thermally conductive material having at least the more central area of its planar upper surface exposed to ambient for efficient heat exchange away from the MPM. The top heat spreader 530 has a thicker central portion, inboard of the wire bond sites on the top package, and the thicker portion is affixed to the upward facing side 519 of the top package using an adhesive 532. The thickness of the heat spreader may in some embodiments be in the range 0.2 to 0.6 mm, nominally 0.4 mm. The top heat spreader may be, for example, constructed of metal (such as copper, or aluminum). Where the top heat spreader is made of copper, the lower surface is preferably treated to have a black oxide, for improved adhesion to the attachment material beneath; the exposed upper surface may be treated to form a black oxide, or it may be provided with a matte nickel (plate) surface. The adhesive 532 may optionally be a thermally conductive adhesive, such as a thermally conductive epoxy, to provide improved heat dissipation; and the adhesive may be electrically nonconductive, in embodiments having exposed electrical features on the upward facing ("lower") side. Usually the top heat spreader is affixed to the top package before the molding material is injected for the MPM encapsulation 707. The periphery of the top heat spreader may be encapsulated with the MPM molding material. In the embodiment of FIG. 7C a step like re-entrant feature 534 is provided on the periphery of the heat spreader 530 to allow for better mechanical integrity of the structure with less delamination from the molding compound.

As a further alternative, an MPM as in FIG. 7A or FIG. 7B can be provided with a top heat speader formed of a thermally conductive material having a generally planar central portion situated over the top package, and peripheral supporting members extending from near the edges or the corners of the generally planar central portion to the upper surface of the bottom package substrate 312, outside the z-interconnect bond pads and near the edge of bottom package. The upper surface of the planar portion is exposed to ambient at the MPM upper surface for efficient heat exchange away from the MPM. The top heat spreader may be formed, for example, of a sheet of metal (such as copper), for example by stamping. The supporting members can optionally be affixed to the upper surface of the bottom package substrate using an adhesive. The heat spreader supporting members are embedded in the MPM encapsulant 707 during the molding material curing process. As in the embodiment of FIG. 6B a step like re-entrant feature can be provided on the periphery of the planar upper portion of the heat spreader to allow for better mechanical integrity of the structure with less delamination from the molding compound. In this embodiment the space between the lower surface of the planar central portion of the heat spreader and the upward facing surface 519 of the top package is filled by a thin layer of the MPM molding.

As a further alternative, an MPM as in FIG. 7A or FIG. 7B can be provided with a simple planar heat spreader, with no supporting members, that is not attached to the upper surface of the top package molding. In such embodiments, as in the embodiment of FIG. 6B, the top heat spreader can be a generally planar piece of a thermally conductive material such as, for example, a sheet of metal (such as copper or aluminum), and at least the more central area of the upper surface of the planar heat spreader is exposed to ambient for efficient heat exchange away from the MPM. Here, the heat spreader does not have a thicker central portion inboard of the wire bond sites on the upper package; instead, the space between the lower surface of the simple planar heat spreader and the upward facing surface 519 of the top package may be filled by a thin layer of the MPM molding, and such a simple planar heat spreader may be affixed to the MPM encapsulant 707 during the molding material curing process. The periphery of such an unattached simple planar top heat spreader can be encapsulated with the MPM molding material, as in the attached planar heat spreader of FIG. 7C, and may be provided with a step-like re-entrant feature on the periphery to allow for better mechanical integrity of the structure with less delamination from the molding compound.

An MPM structure having a heat spreader, as in FIG. 7C, or in the alternative embodiments described above, can provide significant thermal enhancement and may provide electrical shielding over the module, which can be critical to MPMs that combine RF and digital chips.

An advantage of a structure as in FIGS. 7B, 7C is significant thermal performance and, optionally, electrical shielding at the bottom package, which can be particularly important critical, for example, in MPM that combine RF and digital chips. It is not necessary to have both a bottom package heat spreader and a top heat spreader for all applications. Alternately one or the other may be adequate depending on the end product needs.

In some modules having flip chip interconnection of the bottom package die to the bottom package substrate, for example, the die in the bottom BGA may be interconnected with the bottom BGA substrate by flip-chip interconnect in a "die up" configuration, in which the bottom package die is carried on the lower surface of the bottom package substrate. Usually the bottom package die attach region in such a configuration is situated about the center of the substrate area, and the second-level interconnect balls are arranged peripherally near two or (more usually) all four of the substrate edges. The die-up flip chip and its flip chip interconnect structures are located within the standoff height of the second-level interconnect structures, and, accordingly, the bottom package die in such configurations contributes nothing to the overall thickness of the MPM. Such a configuration can provide higher electrical performance in the bottom package (and, therefore, in the module) not only because flip chip interconnect is employed but also because the connection of the die to the solder balls is more direct and requires shorter metal traces, and avoids vias. Moreover, the die-up configuration can avoid a netlist inversion effect, which typically is a consequence of die-down configuration, which may be desirable in some applications. As is well known, a die arranged to face upward (die-up) has a netlist that is the mirror image of the same die when facing downward (die-down). No separate molding is required for the lower BGA package in this configuration; a matrix mold saw-singulated molding encapsulates the inverted upper LGA package, and an MPM molding encapsulates the stacked packages in the completed multi-package module.

Figure 8A:
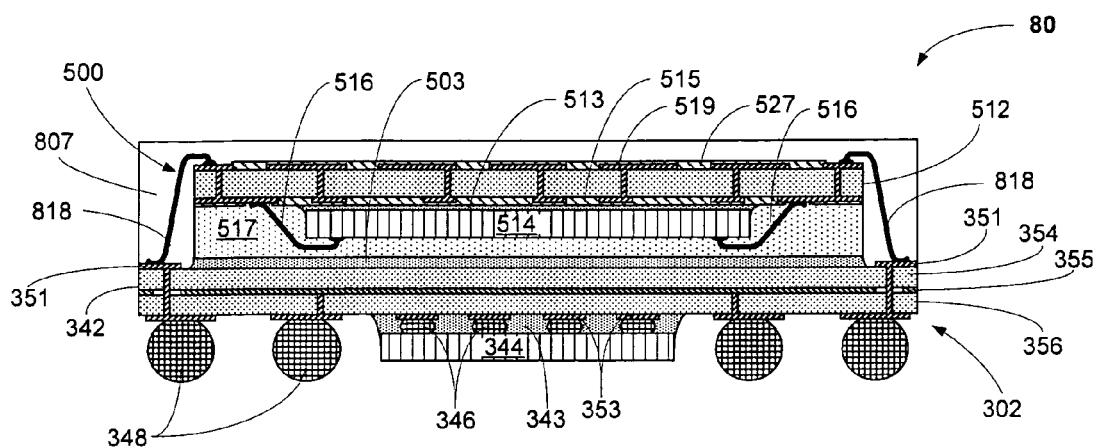
FIG. 8A is a diagrammatic sketch in a sectional view thru an embodiment of a multi-package module having wire bond z-interconnection between stacked bottom flip chip (die up) BGA and inverted top LGA semiconductor packages according to a further aspect of the invention.

Particularly, by way of example, FIG. 8A is a diagrammatic sketch in a sectional view showing a multi-package module 80 according to another aspect of the invention, in which an inverted land grid array package 500 is stacked over a flip chip BGA in a die-up configuration 302, and the stacked packages are interconnected by wire bonding. In the bottom BGA package, 302 the die 344 is attached on the lower side of the BGA substrate 342.

As the FIG. illustrates, this structure provides for a thinner MPM because the bottom package die is on the underside of the bottom package in the area between the peripherally situated solder balls. Such a configuration can have a higher electrical performance not only because it employs a flip chip connection but also because it provides more direct electrical connection of the die to the solder balls, with shorter metal traces and without requiring vias (as are required in a configuration as in FIGS. 7A or 7B or 7C) for connection between the die and the solder balls. Furthermore the die-up configuration enables this package to be netlist compatible to wire bonding, as may be desired in some applications. Netlist is the sum of all pairs of connections between the die and the solder balls. When the die faces up "die-down" it has a connection pattern that is the mirror image of the pattern in the same die when the die is facing down "die-up".

In a configuration as in FIG. 8A the top LGA package is inverted and attached with adhesive onto the upper side of the BGA, and then is wire bonded and the module is molded. The bottom flip chip BGA package 302 includes a substrate 342 having a patterned metal layer 353 onto parts of which the die 344 is connected by flip chip bumps 346, such as solder bumps, gold stud bumps or anisotropically conducting film or paste. Any of various substrate types may be used; the bottom package substrate 342 shown by way of example in FIG. 8A has two metal layers 351, 353, each patterned to provide appropriate circuitry. Bottom package substrate 342 additionally has a metal layer 355 sandwiched between dielectric layers 354, 356. Metal layer 355 has voids at selected locations, to permit connection of the metal layers 351, 353 by vias therethrough and, accordingly, selected parts of the patterned metal layers 351, 353 are connected by way of vias through the substrate layers 354, 356 and through the voids in the sandwiched metal layer 355. Selected parts of the patterned metal layer 353 are connected by way of vias through substrate layer 356 to sandwiched metal layer 355.

Flip chip bumps 346 are attached to a patterned array of bump pads on the active surface of the die 344 and, as the active surface of the die faces upward in relation to an downward-facing patterned metal layer of the substrate, such an arrangement may be referred to as a "die up" flip chip package. A polymer underfill 343 between the die and the die attach region of the substrate provides protection from ambient and adds mechanical integrity to the structure.

As noted above, the metal layers 351, 353 are patterned to provide appropriate circuitry, and the sandwiched metal layer 355 has voids at selected locations to allow interconnections (without contact with the sandwiched metal layer 355) between selected traces on the upper and lower metal layers 351, 353. Particularly, for example, the lower metal layer is patterned in the die attach area to provide attachment sites for the flip chip interconnect bumps 353; and, for example, the lower metal layer is patterned nearer the margin of the bottom package substrate 342 to provide attachment sites for the second-level interconnect solder balls 348, by which the completed MPM is attached by solder reflow to underlying circuitry (not shown). And particularly, for example, the upper metal layer is patterned near the margin of the bottom package substrate 342 to provide attachment sites for wire bonds connecting the top package to the bottom package. Ground lines in the circuitry of metal layer 353 are connected through vias to the sandwiched metal layer 355; selected ones of the solder balls 348 are ground balls, which will be attached to ground lines in the underlying circuitry when the MPM is installed. Thus, the sandwiched metal layer 355 serves as a ground plane for the MPM. Selected others of the solder balls 348 are input/output balls or power balls, and these are, accordingly, attached to solder ball sites on input/output or power lines, respectively, in the circuitry of metal layer 353.

Referring still to FIG. 8A, the top package 500 is constructed generally similarly to the top LGA package 500 of the multipackage module 50 of FIG. 5A. Particularly, the top package 500 includes a die 514 attached onto a top package substrate 512. Any of various substrate types may be used; the top package substrate 512 shown by way of example in FIG. 8A, as in the top package substrate of FIG. 5A, has two metal layers, each patterned to provide appropriate circuitry and connected by way of vias. The die is conventionally attached to a surface of the substrate using an adhesive, typically referred to as the die attach epoxy, shown at 513 in FIG. 8A and, in the configuration in FIG. 8A, the surface of the substrate onto which the die is attached may be referred to as the "upper" surface, and the metal layer on that surface may be referred to as the "upper" metal layer, although the die attach surface need not have any particular orientation in use, and, for purposes of description the die attach side of the upper package substrate is the downward facing side when the top package is inverted in the multi-package module according to the invention.

In the top LGA package 500 in the embodiment of FIG. 8A the die is wire bonded onto wire bond sites on the upper metal layer of the substrate to establish electrical connections. The die 514 and the wire bonds 516 are encapsulated with a molding compound 517 that provides protection from ambient and from mechanical stress to facilitate handling operations, and has a top package molding surface. In the inverted orientation the top package molding surface is downward facing. Solder masks are patterned over the respective metal layers to expose the underlying metal at bonding sites for electrical connection, for example the wire bond sites for bonding the wire bonds 516. In its inverted orientation in the multi-package module, the top package has an upward facing ("lower") surface 519.

The top package 500 is inverted and stacked over the bottom package 300, that is to say, over the upper surface of the bottom package substrate 342, and affixed there using an adhesive, indicated at 503.

The z-interconnect between the stacked top package 500 and bottom package 300 is made by way of wire bonds 518 connecting the upward-facing metal layers of the respective package substrates. The multipackage module structure is protected by formation of a module encapsulant 807, and solder balls 318 are reflowed onto exposed solder ball pads on the lower metal layer of the bottom package substrate, for connection to underlying circuitry, such as a motherboard (not shown in the FIGS.) of a final product, such as a computer.

Structures having a LGA stacked over a flip chip BGA with die up as described for example with reference to FIG. 8A can be assembled with a heat spreader/electrical shield around the bottom package die much as shown in FIG. 6A or FIG. 6B. Accordingly, FIG. 8B is a diagrammatic sketch in a sectional view showing a multi-package module according to another aspect of the invention, in which an inverted LGA is stacked over a flip chip BGA with die up, as in the embodiment of FIG. 8A, and in which the lower BGA is provided with a heat spreader/shield.

Figure 8B:
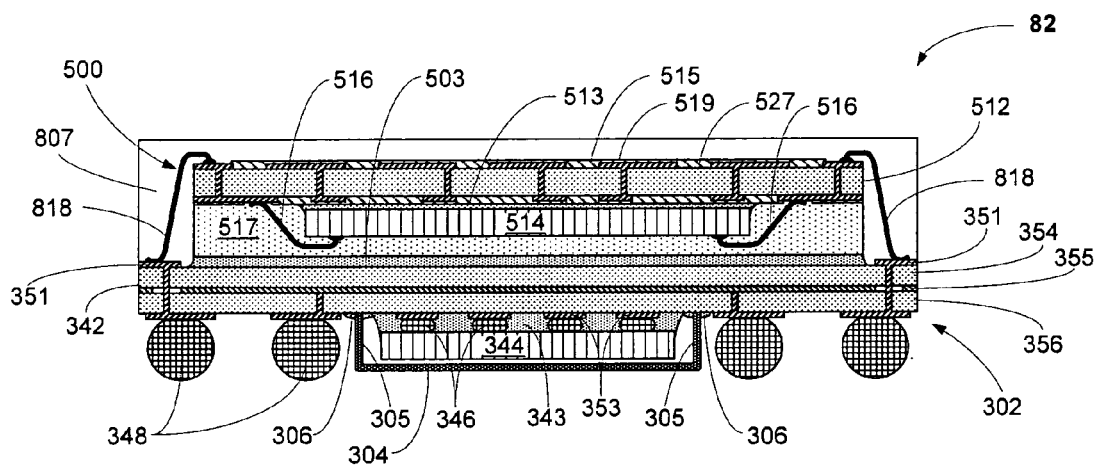
FIG. 8B is a diagrammatic sketch in a sectional view thru an embodiment of a multi-package module having wire bond z-interconnection between stacked bottom flip chip (die up) BGA and inverted top LGA semiconductor packages according to a further aspect of the invention, the bottom package being provided with an electromagnetic shield/heat spreader.

Particularly, referring to FIG. 8B, the bottom BGA package 300 of multipackage module 82 is provided with a metallic (for example, copper) heat spreader that surrounds the die and acts additionally as an electrical shield to electrically contain any electromagnetic radiation from the die in the lower BGA and thereby prevent interference with the die in the upper package. A lower planar part 304 of the heat spreader is supported on the substrate 342 by legs or sidewalls 305. Spots or lines 306 of an adhesive serve to affix the heat spreader supports 305 to the lower surface of the bottom package substrate. The adhesive can be a conductive adhesive, and can be electrically connected to the lower metal layer 353 of the substrate 342, particularly to a ground plane of the circuit and thereby establishing the heat spreader as an electrical shield. Or, the adhesive can be non-conductive and in such a configuration the heat spreader acts only as a heat spreading device. Alternatively, the shield enclosing the upward-facing bottom package die can be soldered or affixed using adhesive to the printed circuit board (or other installation surface for the module) at the time the solder balls are re-flowed to make the connection during installation of the module. Such an arrangement can provide an additional path for heat transfer, and can additionally provide electrical connection of the shield to the installation board, as may be desired for some applications. The supporting parts 305 and the lower planar part 304 of the heat spreader enclose the die 344, and can serve for protection from ambient and from mechanical stress to facilitate handling operations and, particularly, during subsequent testing before the MPM assembly.

The top package 500 of multi-package module 82 is stacked over the bottom package 300 upon a package attach region of the upper surface of the bottom package substrate and affixed there using an adhesive 503. The adhesive 503 can be thermally conductive, to improve thermal dissipation.

The z-interconnection between the top package 500 and the bottom package 300 according to the invention is made by wire bonds 818 between top package interconnect pads in the margin of the top package substrate 512 and bottom package interconnect pads in the margin of the bottom package substrate 342. The wire bonds may be formed in either up-bond or down-bond (forward or reverse bonding) fashion. Parts of the multipackage module structure over the bottom package substrate are protected by formation of a module encapsulant 807.

Solder balls 318 are reflowed onto exposed solder ball pads on the lower metal layer of the bottom package substrate 300, for connection to underlying circuitry, such as a printed circuit board (not shown in the FIGS.).

As will be appreciated from the foregoing, the structure according to the invention allows for pre-testing of both the BGA and LGA before assembly into the multi-package module, to permit rejection of nonconforming packages prior to assembly, and thereby to assure high final module test yields.

The processor chip in a flip chip bottom package according to this aspect of the invention can be, for example, an ASIC, or a GPU, or a CPU, often an ASIC; and the top package can be, for example, a processor chip or, for example, a memory package or an ASIC package. Where the top package is a memory package it can be a stacked die memory package. A shielded flip chip die-up bottom package can be particularly suitable for higher speed applications, particularly for RF frequency processing, as in mobile communications applications.

Optionally, for improved heat dissipation from the multi-package module, a MPM having a flip chip bottom package in a die-up configuration (as shown for example in FIG. 8A or FIG. 8B) may be further provided with a top heat spreader over the top package in addition to the heat spreader/ electrical shield on the bottom package as in FIG. 8B. The optional top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper or aluminum) or of any of a variety of other thermally conductive materials, such as aluminum nitride. The heat spreader has a size and shape to substantially cover the package. The heat spreader can be made thicker in a central area over the top package to increase metal content, and thinner at the periphery so that it does not interfere with the z-interconnect wire bonds. If made thicker in a central area the heat spreader may be affixed to the upward facing surface of the top package. Or, a spacer may be placed over the upward facing surface of the package inboard of the wire bond sites, and the heat spreader may be affixed to the upper surface of the spacer. Alternately the heatspreader can be molded-in, resulting in a similar structure but without the adhesive; that is, the heat spreader may be dropped into the MPM encapsulant mold and affixed at the upper surface of the module during the molding material curing process. Or, the heatspreader may have a generally planar portion over the top package, and a peripheral supporting portion or supporting members resting on or near the upper surface of the bottom package substrate.

Figure 8C:
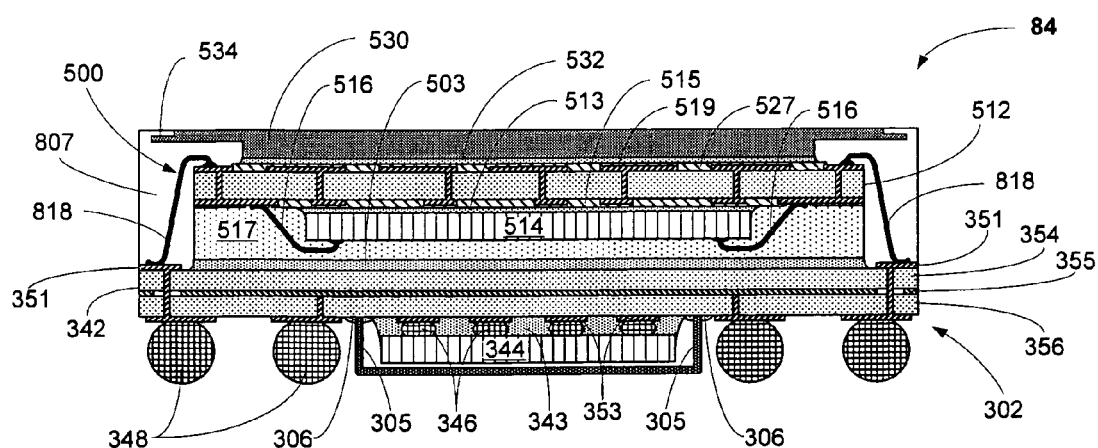
FIG. 8C is a diagrammatic sketch in a sectional view thru an embodiment of a multi-package module having wire bond z-interconnection between stacked lower flip chip (die up) BGA and inverted upper LGA semiconductor packages according to a further aspect of the invention, the bottom package being provided with an electromagnetic shield/heat spreader, and the module being further provided with a top heat spreader.

For example, a top heat spreader having a thicker central region can be affixed to the upward facing surface of the top package as shown diagrammatically in a sectional view in FIG. 8C. The construction of the stacked packages in MPM 84 is generally similar to that of MPM 82 in FIG. 8B, and like structures are identified in the FIGS. by like reference numerals. The top heat spreader 530 in the example of FIG. 8C is a generally planar piece of a thermally conductive material having at least the more central area of its planar upper surface exposed to ambient for efficient heat exchange away from the MPM. The top heat spreader 530 has a thicker central portion, inboard of the wire bond sites on the top package, and the thicker portion is affixed to the upward facing side 519 of the top package using an adhesive 532. The thickness of the heat spreader may in some embodiments be in the range 0.2 to 0.6 mm, nominally 0.4 mm. The top heat spreader may be, for example, constructed of metal (such as copper, or aluminum). Where the top heat spreader is made of copper, the lower surface is preferably treated to have a black oxide, for improved adhesion to the attachment material beneath; the exposed upper surface may be treated to form a black oxide, or it may be provided with a matte nickel (plate) surface. The adhesive 532 may optionally be a thermally conductive adhesive, such as a thermally conductive epoxy, to provide improved heat dissipation; and the adhesive may be electrically nonconductive, in embodiments having exposed electrical features on the upward facing ("lower") side. Usually the top heat spreader is affixed to the top package before the molding material is injected for the MPM encapsulation 807. The periphery of the top heat spreader may be encapsulated with the MPM molding material. In the embodiment of FIG. 8C a step like re-entrant feature 534 is provided on the periphery of the heat spreader 530 to allow for better mechanical integrity of the structure with less delamination from the molding compound.

As a further alternative, an MPM as in FIG. 8A or FIG. 8B can be provided with a top heat spreader formed of a thermally conductive material having a generally planar central portion situated over the top package, and peripheral supporting members extending from near the edges or the corners of the generally planar central portion to the upper surface of the bottom package substrate 342, outside the z-interconnect bond pads and near the edge of bottom package. The upper surface of the planar portion is exposed to ambient at the MPM upper surface for efficient heat exchange away from the MPM. The top heat spreader may be formed, for example, of a sheet of metal (such as copper), for example by stamping. The supporting members can optionally be affixed to the upper surface of the bottom package substrate using an adhesive. The heat spreader supporting members are embedded in the MPM encapsulant 807 during the molding material curing process. As in the embodiment of FIG. 8B a step like re-entrant feature can be provided on the periphery of the planar upper portion of the heat spreader to allow for better mechanical integrity of the structure with less delamination from the molding compound. In this embodiment the space between the lower surface of the planar central portion of the heat spreader and the upward facing surface 519 of the top package is filled by a thin layer of the MPM molding.

As a further alternative, an MPM as in FIG. 8A or FIG. 8B can be provided with a simple planar heat spreader, with no supporting members, that is not attached to the upper surface of the top package molding. In such embodiments, as in the embodiment of FIG. 8B, the top heat spreader can be a generally planar piece of a thermally conductive material such as, for example, a sheet of metal (such as copper or aluminum), and at least the more central area of the upper surface of the planar heat spreader is exposed to ambient for efficient heat exchange away from the MPM. Here, the heat spreader does not have a thicker central portion inboard of the wire bond sites on the upper package; instead, the space between the lower surface of the simple planar heat spreader and the upward facing surface 519 of the top package may be filled by a thin layer of the MPM molding, and such a simple planar heat spreader may be affixed to the MPM encapsulant 807 during the molding material curing process. The periphery of such an unattached simple planar top heat spreader can be encapsulated with the MPM molding material, as in the attached planar heat spreader of FIG. 8B, and may be provided with a step-like re-entrant feature on the periphery to allow for better mechanical integrity of the structure with less delamination from the molding compound.

An MPM structure having a heat spreader, as in FIG. 8C, or in the alternative embodiments described above, can provide significant thermal enhancement and may provide electrical shielding over the module, which can be critical to MPMs that combine RF and digital chips.

An advantage of a structure as in FIGS. 8B, 8C is significant thermal performance and, optionally, electrical shielding at the bottom package, which can be particularly important critical, for example, in MPM that combine RF and digital chips. It is not necessary to have both a bottom package heat spreader and a top heat spreader for all applications. Alternately one or the other may be adequate depending on the end product needs.

Figure 8D:
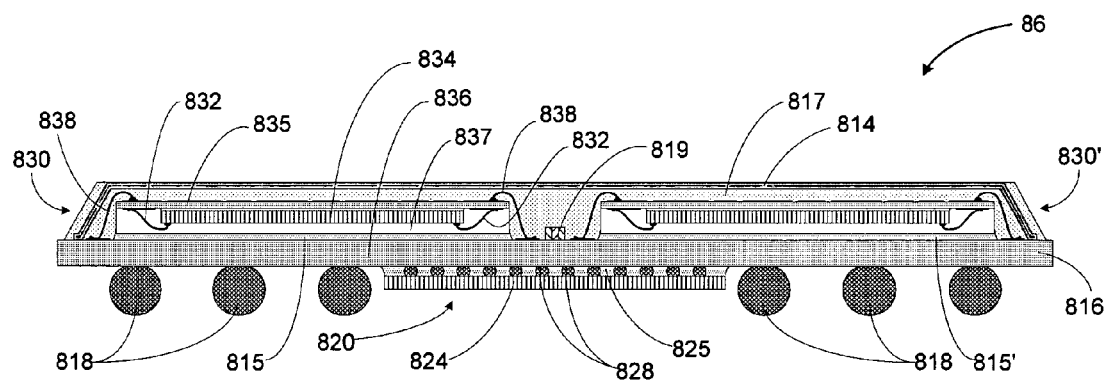
FIG. 8D is a diagrammatic sketch in a sectional view thru an embodiment of a multi-package module having wire bond z-interconnection between stacked lower flip chip (die up) BGA and multiple inverted upper LGA semiconductor packages according to a further aspect of the invention.

Inasmuch as no part of the upper surface of the bottom package substrate in the die-up configuration is occupied by the bottom package die, a plurality of top packages can be stacked over a plurality of package attach regions on the bottom package upper surface. This is illustrated by way of example in FIG. 8D. FIG. 8D is a diagrammatic sketch in a sectional view thru an embodiment of a multipackage module generally at 86, having a processor unit affixed to the lower surface of the bottom package generally as shown in FIG. 8A (flip chip mounted in a "die-up" configuration), and a plurality of inverted LGA packages affixed to the upper side of the bottom package substrate according to an aspect of the invention.

In the illustrative embodiment of FIG. 8D, a module substrate 816, also 836, has a "lower" surface onto which solder balls 818 are attached, for connection by solder reflow to, for example, a printed circuit board (not shown). A bottom package die 820 is mounted onto a die mounting portion of the lower surface of the module 816. As shown in this example, the processor 820 has a flip-chip configuration; it includes a die 824 electrically connected by way of balls or bumps 828 to interconnect sites (not shown) in the lower surface of the module substrate, and affixed to the surface using an adhesive underfill material 825. A plurality of top packages 830, 830' (there may typically be four memory packages; two are shown in the view of FIG. 8D) are mounted on the upper surface of the module substrate 836. In the embodiment illustrated in FIG. 8D the top packages are inverted saw-singulated land grid array (LGA) packages. Referring particularly to LGA package 830, each LGA top package includes a die 834 affixed using an adhesive to a top package substrate 835. The package substrate is, in this example, a two-metal layer laminate, having patterned electrically conductive traces on the upper and lower surfaces of a dielectric layer; selected upper and lower traces are connected by way of vias (not shown) through the dielectric layer. The downward-facing active surface of the die is electrically connected to traces on the die attach "upper" (downward facing) surface of the top package substrate 835 by wire bonds 832. The active surface of the die and the wire bonds are protected by an encapsulant 837. Further referring to FIG. 8D, the inverted top packages 830, 830' are affixed to the bottom package module substrate 836 using an adhesive material 815, 815' between the surface of the encapsulant 837 and the upper surface of the bottom package substrate 836; and wire bonds 838 attached to wire bond pads on the upper surface of the top package substrate 835 provide for electrical connection to wire bond pads in the upper surface of the bottom substrate 836. Additionally, passive devices, e.g., 819, can be affixed to and electrically connected to traces in the upper surface of the bottom package substrate 816. Also, in the illustrative example shown in FIG. 8D, a heat spreader 814 is mounted onto the upper surface of the module substrate and covers top packages 830, 830'; and the top packages and the attachment arms of the heat spreader are encapsulated using an encapsulant material 817. A module such as is illustrated by way of example in FIG. 8D, where the processor is a GPU, for example, may typically have a module footprint about 31 mm×31 mm and an overall profile thickness about 2.8 mm or greater, with a 10.5 mm×10.5 mm GPU and 12 mm×12 mm memory BGA packages.

Multipackage modules configured as, for example in FIG. 8D, can be particularly useful in applications where a large number of memory chips are to be associated with a processor. The memory chips can be provided as top packages in this configuration, and the processor can be provided in the die-up flip chip bottom package. As may be appreciated, shielding may be provided around the bottom package die, as in FIG. 8B or 8C.

Figure 9A:
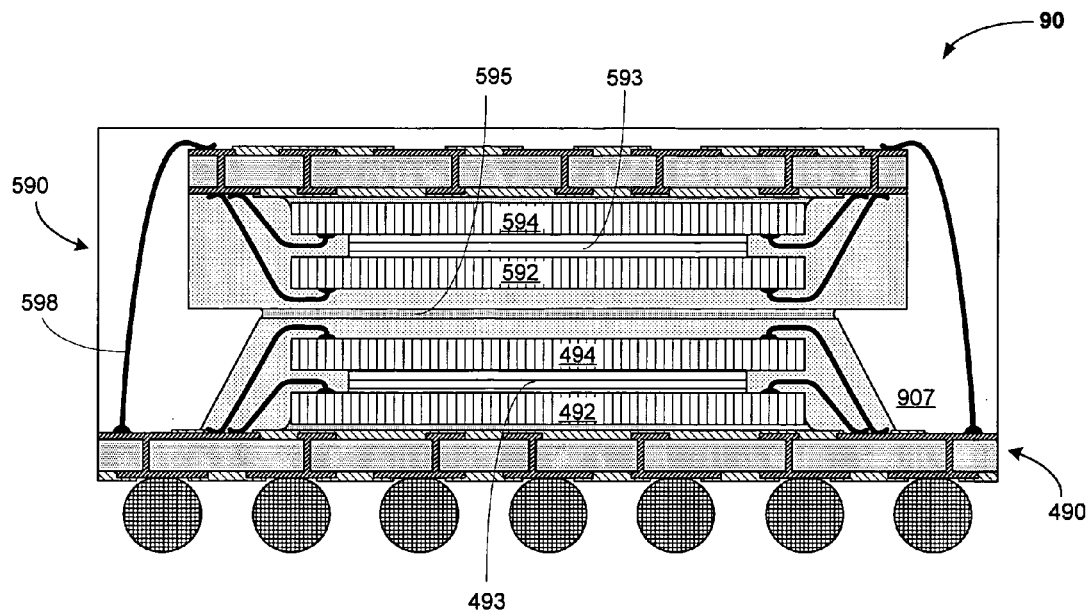
FIG. 9A is a diagrammatic sketch in a sectional view thru an embodiment of a multi-package module having wire bond z-interconnection between stacked lower BGA and inverted upper LGA semiconductor packages according to a further aspect of the invention, in which each of the inverted upper LGA and lower BGA has stacked die wire-bonded to the substrate.
Figure 9B:
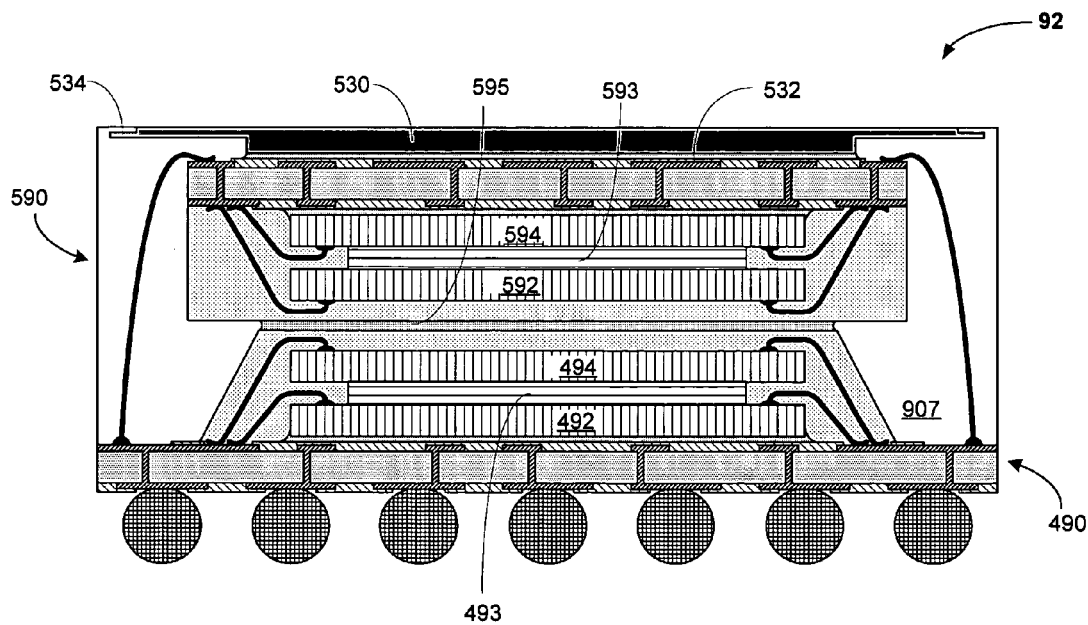
FIG. 9B is a diagrammatic sketch in a sectional view thru an embodiment of a multi-package module having wire bond z-interconnection between stacked lower BGA and inverted upper LGA semiconductor packages according to a further aspect of the invention, in which each of the inverted upper LGA and lower BGA has stacked die wire-bonded to the substrate, and in which the module is provided with a top heat spreader.

According to the invention, either the top package or the bottom package, or both of them, in the multi-package module of the invention can include two or more stacked chips. FIGS. 9A and 9B illustrate, by way of example, embodiments of the invention 90, 92 in which each of the lower BGA package 490 and the inverted upper LGA package 590 has two stacked die. The stacked die in each package in this example are wire-bonded to their respective substrates, and adjacent die are separated by a spacer, as is well known in the stacked-die package art. As will be appreciated, packages having other stacked die configurations, including other die interconnects, can be used in multi-package modules according to the invention, as well as side-by-side plural die arrangements. Referring particularly to FIG. 9A, the bottom package 490 has stacked die 492 and 494 separated by a spacer 493; and the inverted top package 590 has stacked die 592 and 594 separated by a spacer 593. The z-interconnection between the top and bottom packages is formed by wire bonds 598, connecting (in either forward- or reverse-bonding fashion) the upward-facing surfaces of the top and bottom package substrates. The inverted top package 590 is affixed onto the bottom package 490 using an adhesive 595. A module encapsulation 907 encloses parts of the module above the bottom package substrate.

Stacked die packages are well established in the industry, with versions that have up to 5 stacked die in the package. The die have various sizes, and the die in a stacked die package may have the same or different relative sizes. The die are typically square or rectangular, and rectangular and square die of various dimensions may be stacked in a stacked die package. Where the die are rectangular, or have various dimensions, the die may be stacked so that the margin of a lower die in the stack projects beyond the margin of an upper die that is stacked over it. FIGS. 9A and 9B show examples in which the two die in the stack are of the same size. In such embodiments, or in embodiments where an upper die in the stack is larger than a lower one, a spacer is assembled between the die to enable wire bonding of all the die to the LGA substrate.

For improved heat dissipation from the multi-package module having stacked die in one or both of the top and the bottom package, a heat spreader may be provided over the top package. The top heat spreader is formed of a thermally conductive material having at least the more central area of its upper surface exposed at the upper surface of the MPM to ambient for efficient heat exchange away from the MPM. The top heat spreader may be, for example, a sheet of metal (such as copper or aluminum) or of any of a variety of other thermally conductive materials, such as aluminum nitride. The heat spreader has a size and shape to substantially cover the package. The heat spreader can be made thicker in a central area over the top package to increase metal content, and thinner at the periphery so that it does not interfere with the z-interconnect wire bonds. If made thicker in a central area the heat spreader may be affixed to the upward facing surface of the top package. Or, a spacer may be placed over the upward facing surface of the package inboard of the wire bond sites, and the heat spreader may be affixed to the upper surface of the spacer. Alternately the heatspreader can be molded-in, resulting in a similar structure but without the adhesive; that is, the heat spreader may be dropped into the MPM encapsulant mold and affixed at the upper surface of the module during the molding material curing process. Or, the heatspreader may have a generally planar portion over the top package, and a peripheral supporting portion or supporting members resting on or near the upper surface of the bottom package substrate.

The module as shown for example in FIG. 9B is provided with a top heat spreader. The top heat spreader 530 in the example of FIG. 9B is a generally planar piece of a thermally conductive material having at least the more central area of its planar upper surface exposed to ambient for efficient heat exchange away from the MPM. The top heat spreader 530 has a thicker central portion, inboard of the wire bond sites on the top package, and the thicker portion is affixed to the upward facing side of the top package using an adhesive 532. The thickness of the heat spreader may in some embodiments be in the range 0.2 to 0.6 mm, nominally 0.4 mm. The top heat spreader may be, for example, constructed of metal (such as copper, or aluminum). Where the top heat spreader is made of copper, the lower surface is preferably treated to have a black oxide, for improved adhesion to the attachment material beneath; the exposed upper surface may be treated to form a black oxide, or it may be provided with a matte nickel (plate) surface. The adhesive 532 may optionally be a thermally conductive adhesive, such as a thermally conductive epoxy, to provide improved heat dissipation; and the adhesive may be electrically nonconductive, in embodiments having exposed electrical features on the upward facing ("lower") side. Usually the top heat spreader is affixed to the top package before the molding material is injected for the MPM encapsulation 907. The periphery of the top heat spreader may be encapsulated with the MPM molding material. In the embodiment of FIG. 9B a step like re-entrant feature 534 is provided on the periphery of the heat spreader 530 to allow for better mechanical integrity of the structure with less delamination from the molding compound.

As a further alternative, an MPM as in FIG. 9A can be provided with a top heat spreader formed of a thermally conductive material having a generally planar central portion situated over the top package, and peripheral supporting members extending from near the edges or the corners of the generally planar central portion to the upper surface of the bottom package substrate, outside the z-interconnect bond pads and near the edge of bottom package. The upper surface of the planar portion is exposed to ambient at the MPM upper surface for efficient heat exchange away from the MPM. The top heat spreader may be formed, for example, of a sheet of metal (such as copper), for example by stamping. The supporting members can optionally be affixed to the upper surface of the bottom package substrate using an adhesive. The heat spreader supporting members are embedded in the MPM encapsulant 907 during the molding material curing process. As in the embodiment of FIG. 9B a step like re-entrant feature can be provided on the periphery of the planar upper portion of the heat spreader to allow for better mechanical integrity of the structure with less delamination from the molding compound. In this embodiment the space between the lower surface of the planar central portion of the heat spreader and the upward facing surface of the top package is filled by a thin layer of the MPM molding.

As a further alternative, an MPM as in FIG. 9A can be provided with a simple planar heat spreader, with no supporting members, that is not attached to the upper surface of the top package molding. In such embodiments, as in the embodiment of FIG. 9B, the top heat spreader can be a generally planar piece of a thermally conductive material such as, for example, a sheet of metal (such as copper or aluminum), and at least the more central area of the upper surface of the planar heat spreader is exposed to ambient for efficient heat exchange away from the MPM. Here, the heat spreader does not have a thicker central portion inboard of the wire bond sites on the upper package; instead, the space between the lower surface of the simple planar heat spreader and the upper surface of the top package may be filled by a thin layer of the MPM molding, and such a simple planar heat spreader may be affixed to the MPM encapsulant 907 during the molding material curing process. The periphery of such an unattached simple planar top heat spreader can be encapsulated with the MPM molding material, as in the attached planar heat spreader of FIG. 9B, and may be provided with a step-like re-entrant feature on the periphery to allow for better mechanical integrity of the structure with less delamination from the molding compound.

In some configurations the inverted top package can be constructed having a die on a substrate formed in the manner of a bump chip carrier ("BCC"). In a conventional BCC substrate, the die is affixed, using an adhesive, onto an upper surface of the leads, with the active surface of the die facing away from the leads. That is, the die is affixed with the passive side toward the upper surface of the leads. The leads have contact dents, formed convex on the lower side and concave on the upper side of the leads. The die is electrically connected by wire bonding from pads on the active side of the die to wire bonding sites in the concavities. The bump convexities on the lower side of the leads provide a standoff for direct interconnect of the BCC with an underlying printed circuit, for example.

Conventionally the BCC leads are formed by deposition or plating on the surface a blank having depressions situated where the dents are to be located. Deposition or plating is done by a series of by masking and deposition steps until the desired lead buildup is formed in the desired shapes at the desired locations on the blank surface. Then the die is affixed, passive side down, onto the upper surface of a die attach portion of the leadframe structure, using an adhesive; and the die interconnection is formed by wire bonding between wire bond pads on the die and corresponding concave (upper) surfaces of the dents. A molding step is carried out, to encapsulate the die and wire bonds and to lend mechanical integrity to the assembly. Then the blank is stripped away, exposing the lower surfaces of the leads and of the convex surface of the bumps. Conventionally the BCC constructs are made in an array and are saw- or punch-singulated. At this point the BCC package is ready for mounting.

BCC has been used primarily for RF or analog chips, which are small, that is from submillimeter to 5 mm size rectangular chips.

According to the invention, the inverted top package is constructed as a BCC type package, and the z-interconnect of the top package to the bottom package is made by way of wire bonding between wire bond sites on the lower (upward facing) sides of the leads to wire bond sites on metal layer on the upper surface of the bottom package. Because the top package is inverted, and z-interconnect according to the invention is made by wire bonding, no standoff from the lower side of the BCC substrate is required. That is, the "bumps" on the lower (upward facing) side of the BCC may be very low, and may be substantially flat. Also, according to the invention, the die interconnect wire bond sites on the upper surface of the leads and the z-interconnect sites on the lower surface of the leads need not be at corresponding opposing positions, although it may be advantageous for them to be so situated.

The BCC substrate for the top package according to the invention is built up by serial deposition or plating of thin metal layers, preferably layers of Pd, Ni, Pd, and Au (Pd/Ni/Pd/Au), nominally for example of thicknesses 0.5 μm/5 μm/0.1 μm/<0.1 μm, respectively. For wire bonding interconnect, a gold (preferred) or aluminum or silver finish is employed on the wire bond pad surfaces. The substrate is very thin, having a thickness typically in the range 7 μm to 10 μm. Additionally, the bumps can be made very small on BCC substrates, typically about 75 μm. Die can be stacked over the BCC following established stacking techniques employing laminate or tape substrates.

Figure 10A:
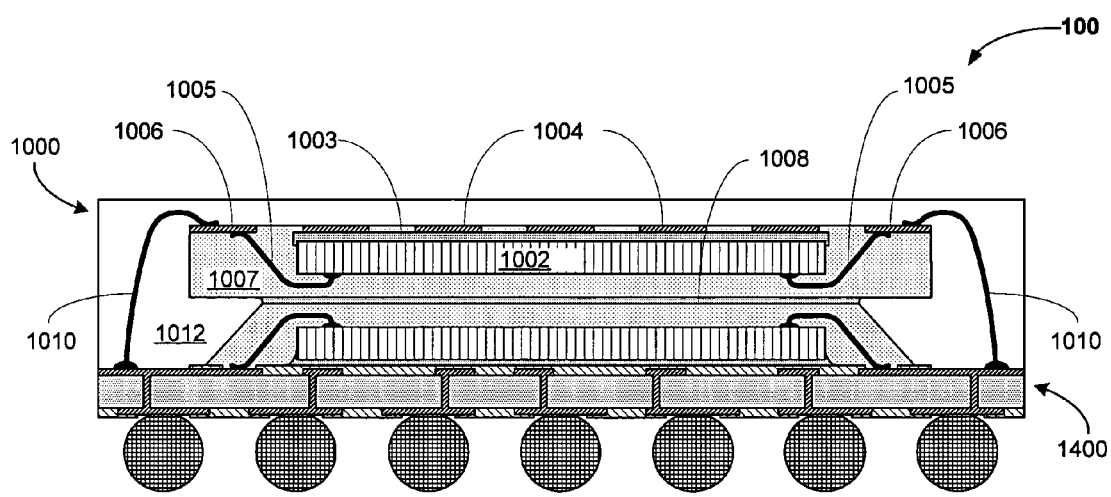
FIG. 10A is a diagrammatic sketch in a sectional view thru an embodiment of a multi-package module having wire bond z-interconnection between stacked bottom BGA and inverted top semiconductor packages according to a further aspect of the invention, in which the top package is a BCC package.
Figure 10B:
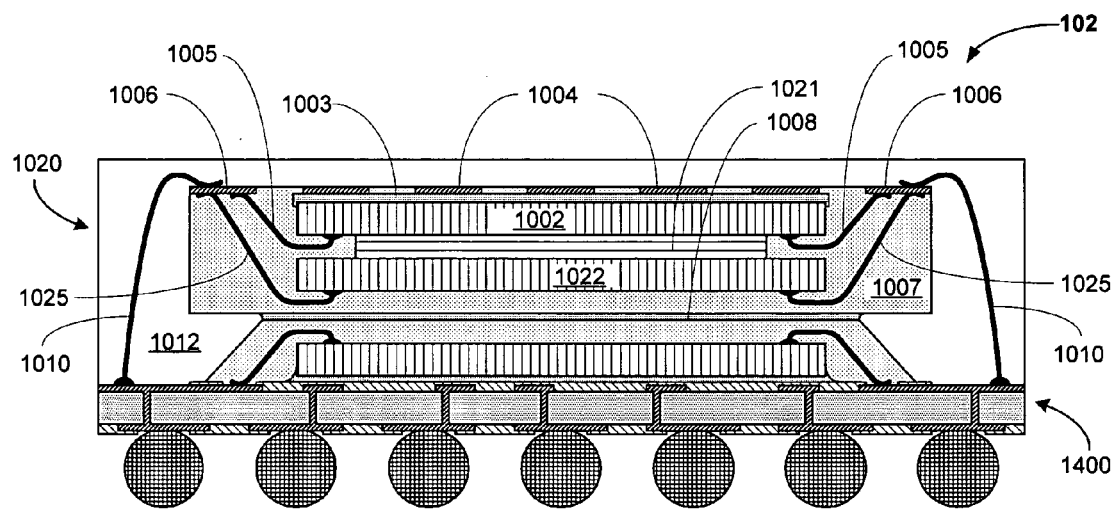
FIG. 10B is a diagrammatic sketch in a sectional view thru an embodiment of a multi-package module having wire bond z-interconnection between stacked bottom BGA and inverted top semiconductor packages according to a further aspect of the invention, in which the top package is a BCC package having an additional die stacked on the BCC die.

FIGS. 10A and 10B show examples of multipackage modules, generally at 100 and at 102, respectively, having inverted BCC top packages 1000, 1020, respectively, stacked over BCC bottom packages 1400 according to the invention. The BCC bottom packages in these examples are BGA packages substantially similar to the BGA bottom package as shown in FIG. 5A, for example, and the various parts, readily identifiable by reference to FIG. 5A, are not separately renumbered in FIGS. 10A and 10B. The top BCC type package 1000 in FIG. 10A includes a die 1002 affixed using an adhesive 1003 to an "upper" surface of a die attach portion 1004 of a built-up lead frame structure additionally having interconnect leads 1006. The die is interconnected by wire bonds 1005 connecting pads on the active side of the die with the "upper" surface of corresponding leads 1006. As noted above, the BCC according to the invention may be a standard BCC, having standoff bumps on the leads; or, because there is no need for standoff, the leads may be substantially flat, as may be preferred. The die 1002, the wire bonds 1005, and the exposed upper surfaces of the leads 1006 are protected by an encapsulation 1007. The top packages 1000 may be made in array fashion, and saw- or punch-singulated to provide separate top packages for subsequent processing.

The completed top package 1000, 1020 is inverted and affixed upper side downward upon an upper surface of a prepared (and tested) BGA bottom package 1400, using an adhesive 1008. The z-interconnect between the top and bottom packages is made by wire bonds (forward or reverse) 1010 between the "lower" (upward-facing) surfaces of the leads 1006 and the upper surfaces of wire bond attach sites on the upper metal layer of the BGA substrate. Solder balls are affixed to the lower surface of the bottom package substrate for attachment of the package to, for example, a printed circuit board for installation in a device. The structures above the bottom package substrate are covered by an encapsulation 1012, and the package is saw- or punch-singulated.

In FIG. 10B, the top package 1020 has an additional die 1022 stacked on the "upper" (downward facing) side of the die 1002 that is directly mounted on the BCC substrate. The additional die 1022 is interconnected to the leads by wire bonds 1025 between wire bond pads in the die and wire bond sites on the upper surface of the leads. In this example, a spacer 1021 is employed between the BCC die and the additional die to provide clearance for the loops of the wire bonds 1005.

Figure 11A:
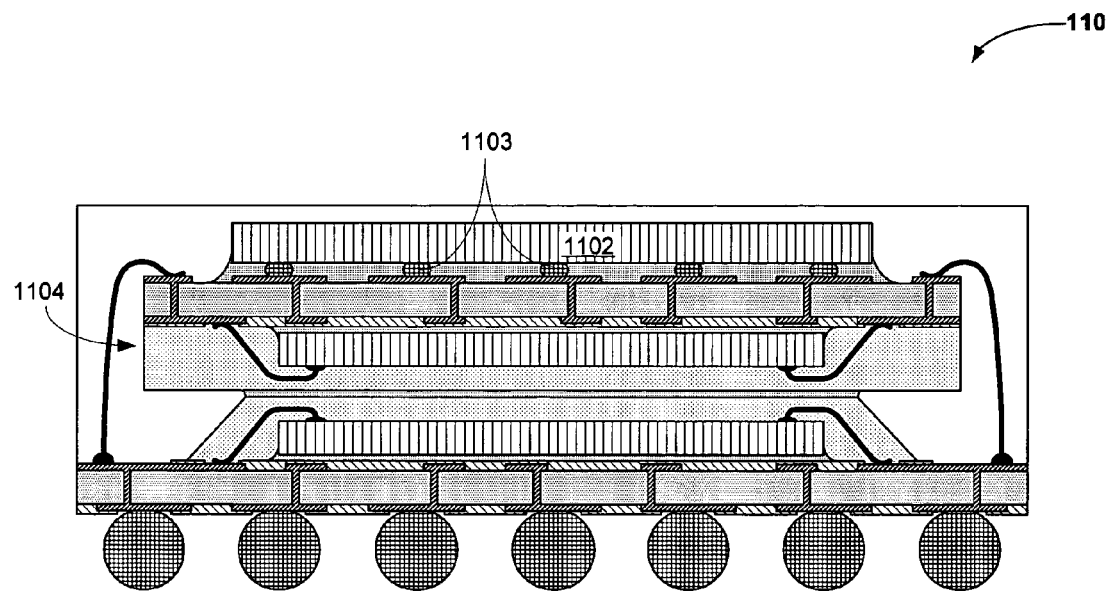
FIG. 11A is a diagrammatic sketch in a sectional view thru an embodiment of a multi-package module having wire bond z-interconnection between stacked bottom BGA and inverted top LGA semiconductor packages according to a further aspect of the invention, in which the die in the bottom BGA is wire-bonded to the substrate, and in which a first die on the downward facing surface of the inverted top LGA is wire-bonded to the LGA substrate and a second die on the opposite (upward facing) surface of the top LGA is flip-chip interconnected to the LGA substrate.
Figure 11B:
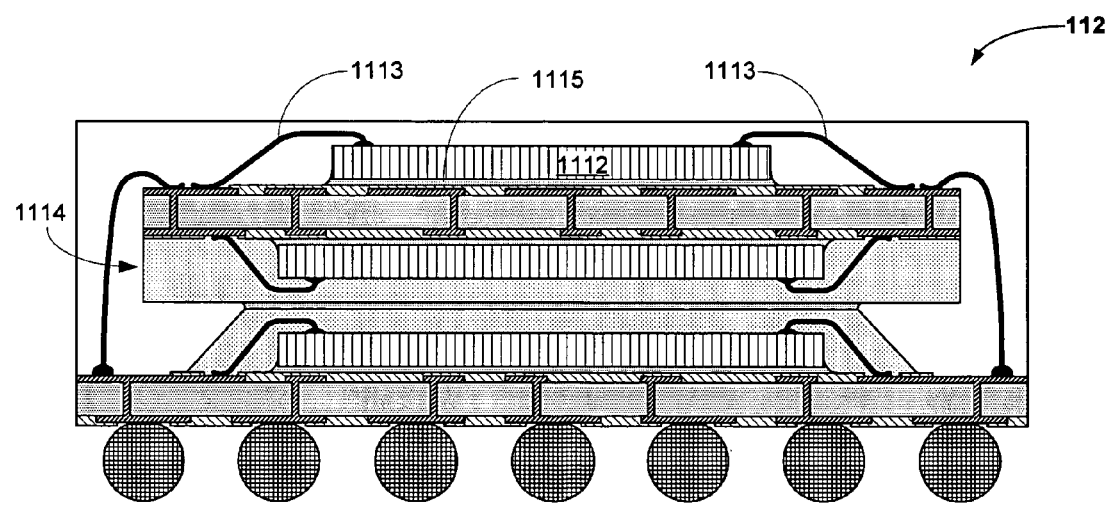
FIG. 11B is a diagrammatic sketch in a sectional view thru an embodiment of a multi-package module having wire bond z-interconnection between stacked bottom BGA and inverted top LGA semiconductor packages according to a further aspect of the invention, in which the die in the bottom BGA is wire-bonded to the substrate, and in which both a first die on the downward facing surface of the inverted top LGA and a second die on the upward facing surface of the bottom package substrate are wire-bonded to the top LGA substrate.

In other configurations according to the invention, an additional chip may be attached to the bottom (upward) side of the inverted top package, using either a flip chip interconnect (as shown for example generally at 110 in FIG. 11A) or wire bond interconnect (as shown for example generally at 112 in FIG. 11B) to produce an MPM having increased functionality. In FIG. 11A the additional die 1102 is connected to sites on the top package 1104 upward facing surface by clip chip interconnections 1103. In FIG. 11B the additional die 1112 is affixed to the top package 1114 upward facing surface using an adhesive 1115, and the interconnection is made by wire bonds 1113 between wire bond pads (not shown) on the active surface of the additional die 1112 and wire bond sites on the top package 1114 "lower" (upward-facing) metal layer.

Figure 11C:
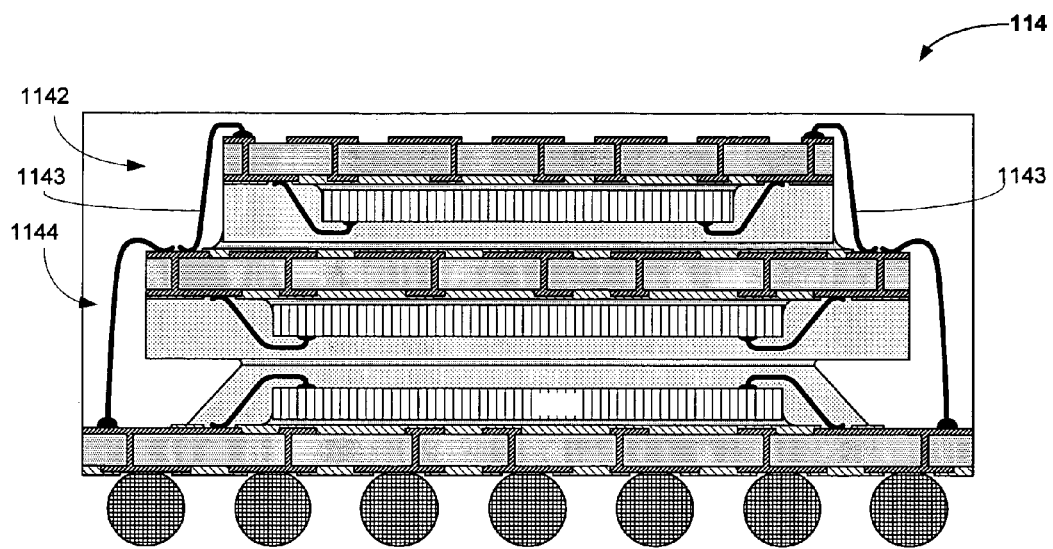
FIG. 11C is a diagrammatic sketch in a sectional view thru an embodiment of a multi-package module having wire bond z-interconnection between stacked bottom BGA and inverted top LGA semiconductor packages according to a further aspect of the invention, in which a third package is stacked over the inverted top LGA package, and is wire bonded thereto.
Figure 11D:
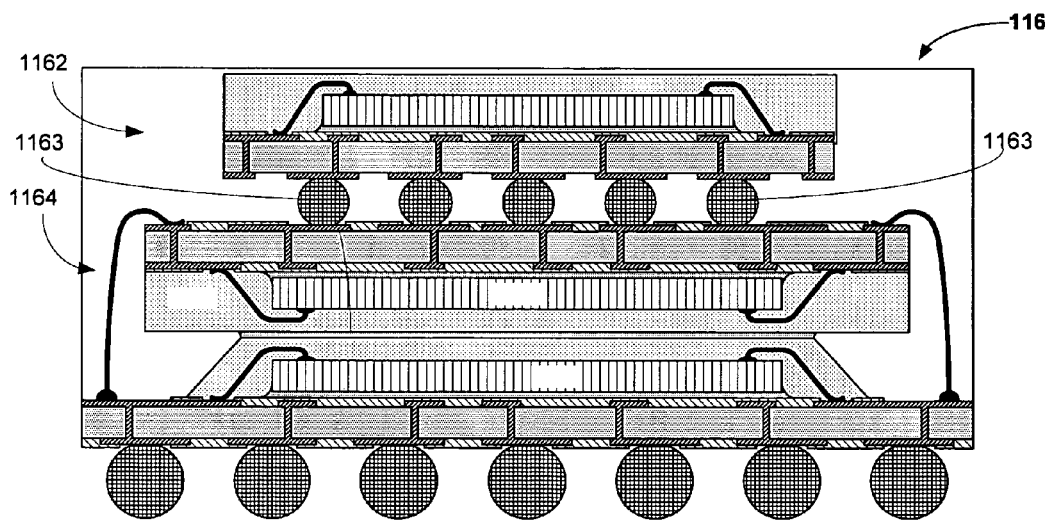
FIG. 11D is a diagrammatic sketch in a sectional view thru an embodiment of a multi-package module having wire bond z-interconnection between stacked bottom BGA and inverted top LGA semiconductor packages according to a further aspect of the invention, in which a third package is stacked over the inverted top LGA package, and is connected by solder balls thereto.

In still other configurations according to the invention, an additional package is attached on the upward facing surface of the inverted top package. The additional package can also be an inverted LGA, as appears for example generally at 114 in FIG. 11C, and the z-interconnection of the additional LGA 1142 and the inverted LGA 1144 to which it is attached can be made by wire bonding 1143. Or, the additional package can be upside upward, as appears for example generally at 116 in FIG. 11D, and the z-interconnection of the additional BGA 1162 to the inverted LGA 1164 beneath can be made by solder ball interconnection by way of reflowed solder balls 1163.

As will be appreciated, in all its various aspects the invention features a lower BGA package and an inverted upper LGA package stacked over the lower BGA package, and the invention features wire bonding as the z-interconnect method between stacked packages.

The multi-package module according to the invention can be used for building computers, and, for example, in telecommunications, consumer and industrial electronics devices. The invention provides for assembly of more than one semiconductor in a thin and minimal footprint package at high final test yields. Construction of the individual packages allows testing before they are assembled into the MPM, assuring that only acceptably good package components are employed in MPM assembly and, accordingly, ensuring high MPM assembly yields.

The invention provides for flexibility in module design, particularly in interconnect configuration, and enables the use of standard packages, reducing the need for custom design and reducing cost. The inverted upper package in the module is assembled using either of the two most common methods of singulation, namely saw or punch singulation. The lower package is cavity molded to expose the bond fingers for z-interconnect.

Attaching the upper package upside down over the lower package brings the bottom side upward in the inverted upper package and thereby leaves the bottom side exposed. This allows wire bonding directly from the upward surface of the inverted mold array saw singulated upper packages to the bottom package. Moreover, a heatspreader can be attached to the exposed bottom (upward) side of the upper package, to increase power dissipation of the MPM to ambient by way of the upward surface of the heatspreader.

Additionally, exposing the bottom side of the upper package permits attachment of and electrical connection of an additional die or of an additional package, to the bottom side of the top package to further increase functionality in the same footprint.

Because according to the invention the z-interconnect between the inverted upper package and the lower package is by otherwise conventional wire bonding, providing advantages in stacking of standard packages, established manufacturing infrastructure, low cost, design flexibility and thin package.

Generally, the LGAs stacked on a lower BGA must be smaller (in the x-y plane) than the BGA to allow space at the periphery for the wire bonds. The wire diameter typically is of the order of 0.025 mm (0.050 to 0.010 mm range). The wire distance to the LGA substrate edge can differ in various embodiments, but is no less than a wire diameter. The relative sizes of BGA and LGA are determined primarily by the maximum die size in each. The die thickness and mold cap thickness primarily determine how many die can be stacked in one package.

Procedures in processes for making BGA packages and LGA packages for use in the invention are well established in the industry for both the wire bonded and the flip chip types of packages.

Testing of BGAs is well established in the industry, and typically is done by accessing contact to the solder ball pads. The LGAs can be tested in either of two ways, namely by accessing the LGA pads on the lower surface of the LGA of the substrate, similar to the pads of the solder balls in a BGA; or by accessing the z-interconnect pads on the upper surface of the substrate. The completed MPM assembly can be tested in the same as for testing BGAs.

The MPM assembly process is similar for the configurations according to the various aspects of the invention. Generally, the process includes steps of providing a first molded package including a first package substrate and at least one die attached to the first package substrate, dispensing adhesive onto an upper surface of the first molded package, placing a second molded package including a second package substrate and at least one die such that a lower surface of the second substrate contacts the adhesive on the upper surface of the first package, during the adhesive, and forming z-interconnects between the first and second substrate. Advantageously, the packages can be tested prior to assembly, and package is not meeting requirements for performance or reliability can be discarded, so that first packages and second package is tested as "good" are used in the assembled module.

Figure 12:
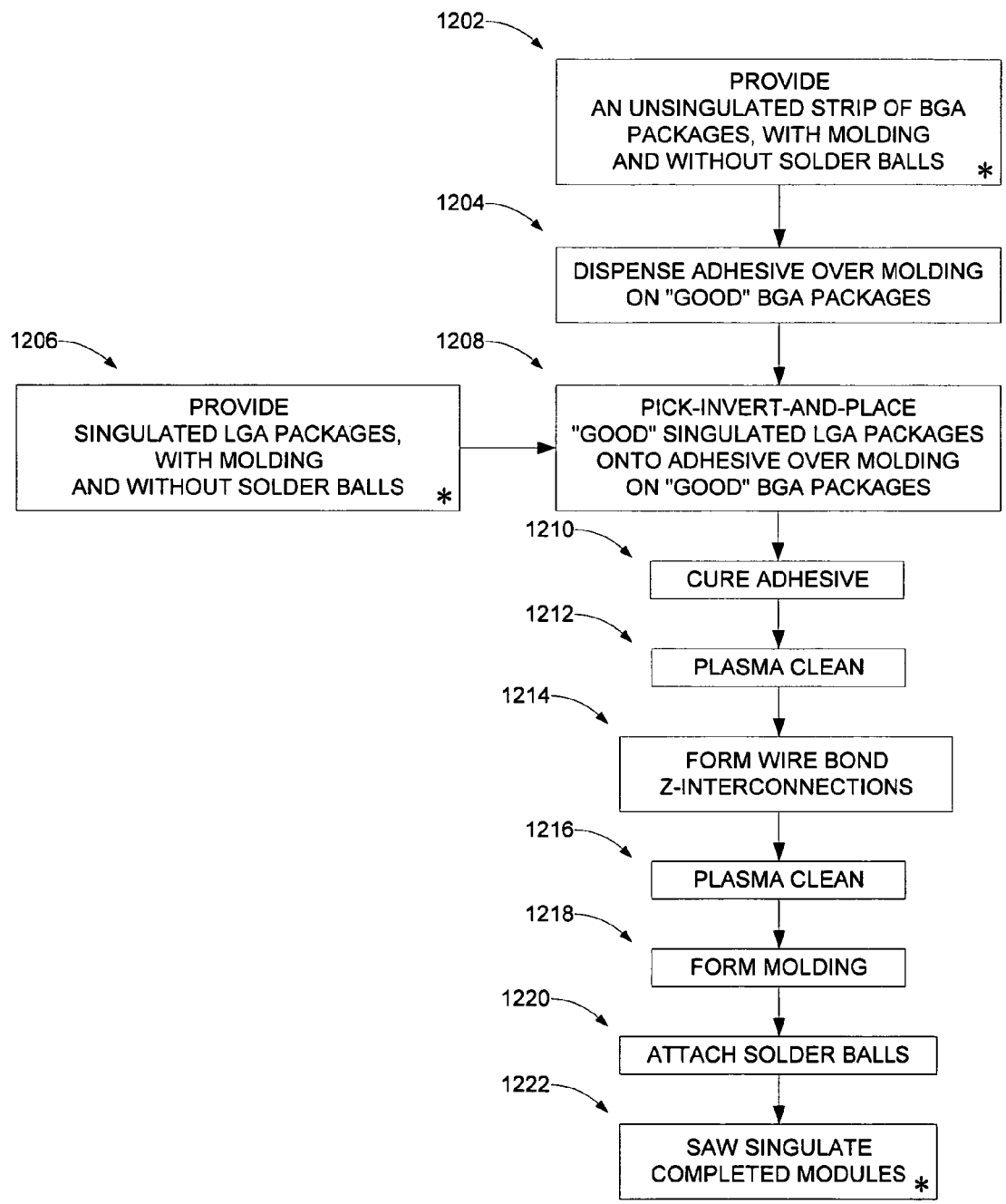
FIG. 12 is a flow diagram showing a process for assembly of a multi-package module according to the invention.

FIG. 12 is a flow diagram showing a process for assembly of a multi-package module as shown for example in FIG. 5A. In a step 1202, an unsingulated strip of ball grid array packages is provided. The die and wire bond structures on the ball grid array packages are protected by a molding. The BGA packages in the strip preferably are tested (as indicated in the FIG. by *) for performance and reliability before they are taken to subsequent steps in the process. Only packages identified as "good" are subjected to subsequent treatment. In a step 1204, adhesive is dispensed over the upper surface of the molding on "good" BGA packages. In a step 1206, singulated land grid array packages are provided. The singulated LGA packages are protected by a molding, and preferably are tested (*) and identified as "good". In a step 1208, a pick-and-place operation is carried out to invert and place "good" LGA packages on the adhesive over the molding on the "good" BGA packages. In a step 1210, the adhesive is cured. In a step 1212, a plasma clean operation is performed in preparation for a step 1214 in which wire bond z-interconnections are formed between the stacked top LGA and bottom BGA packages. In a step 1216, an additional plasma clean may be performed, followed by the formation of the MPM molding in a step 1218. In a step 1220, the second-level interconnect solder balls are attached to the underside of the module. In a step 1222, the completed modules are tested (*) and singulated from the strip, for example by saw singulation or by punch singulation, and packaged for further use.

Figure 13:
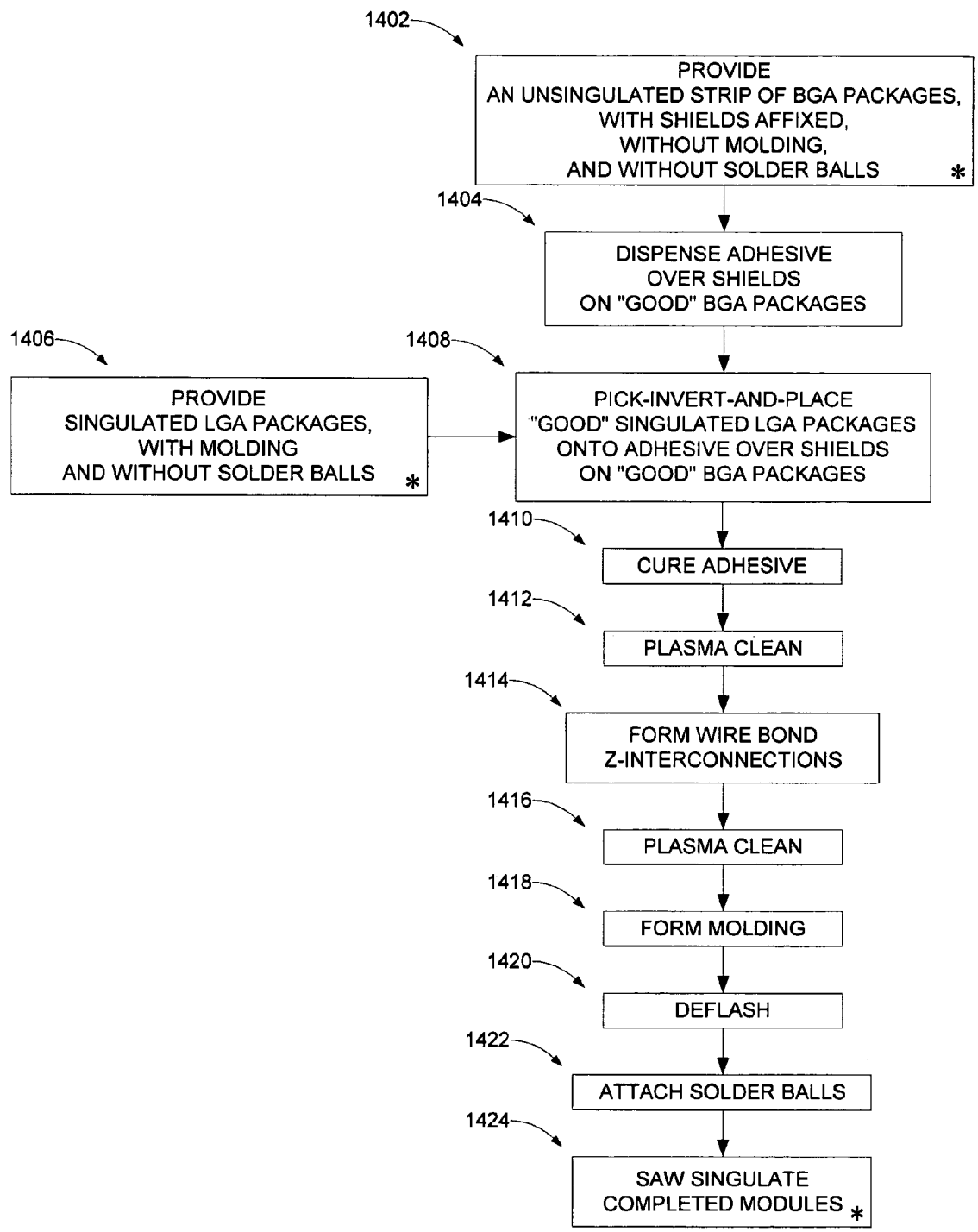
FIG. 13 is a flow diagram showing a process for assembly of a multi-package module according to the invention, in which the bottom package is provided with a heat shield/heat spreader.

FIG. 13 is a flow diagram showing a process for assembly of a multi-package module according to the invention, in which the bottom package is provided with a heat shield/heat spreader. In a step 1402, an unsingulated strip of ball grid array packages is provided. The BGA packages have shields affixed over the die. The shields protect the die and wire bond structures on the ball grid array packages, and accordingly no package molding is required; The BGA packages in the strip preferably are tested (as indicated in the FIG. by *) for performance and reliability before they are taken to subsequent steps in the process. Only packages identified as "good" are subjected to subsequent treatment. In a step 1404, adhesive is dispensed over the upper surface of the shields on "good" BGA packages. In a step 1406, singulated land grid array packages are provided. The singulated LGA packages are protected by a molding, and preferably are tested (*) and identified as "good". In a step 1408, a pick-and-place operation is carried out to invert and place "good" LGA packages on the adhesive over the shields on the "good" BGA packages. In a step 1410, the adhesive is cured. In a step 1412, a plasma clean operation is performed in preparation for a step 1414 in which wire bond z-interconnections are formed between the stacked top LGA and bottom BGA packages. In a step 1416, an additional plasma clean may be performed, followed by the formation of the MPM molding in a step 1418. In a step 1420, a deflash operation may be carried out, to decompose and remove undesirable organic material. The deflash may be carried out by laser, or by chemical or plasma clean. In a step 1422, the second-level interconnect solder balls are attached to the underside of the module. In a step 1424, the completed modules are tested (*) and singulated from the strip, for example by saw singulation or by punch singulation, and packaged for further use.

Figure 14:
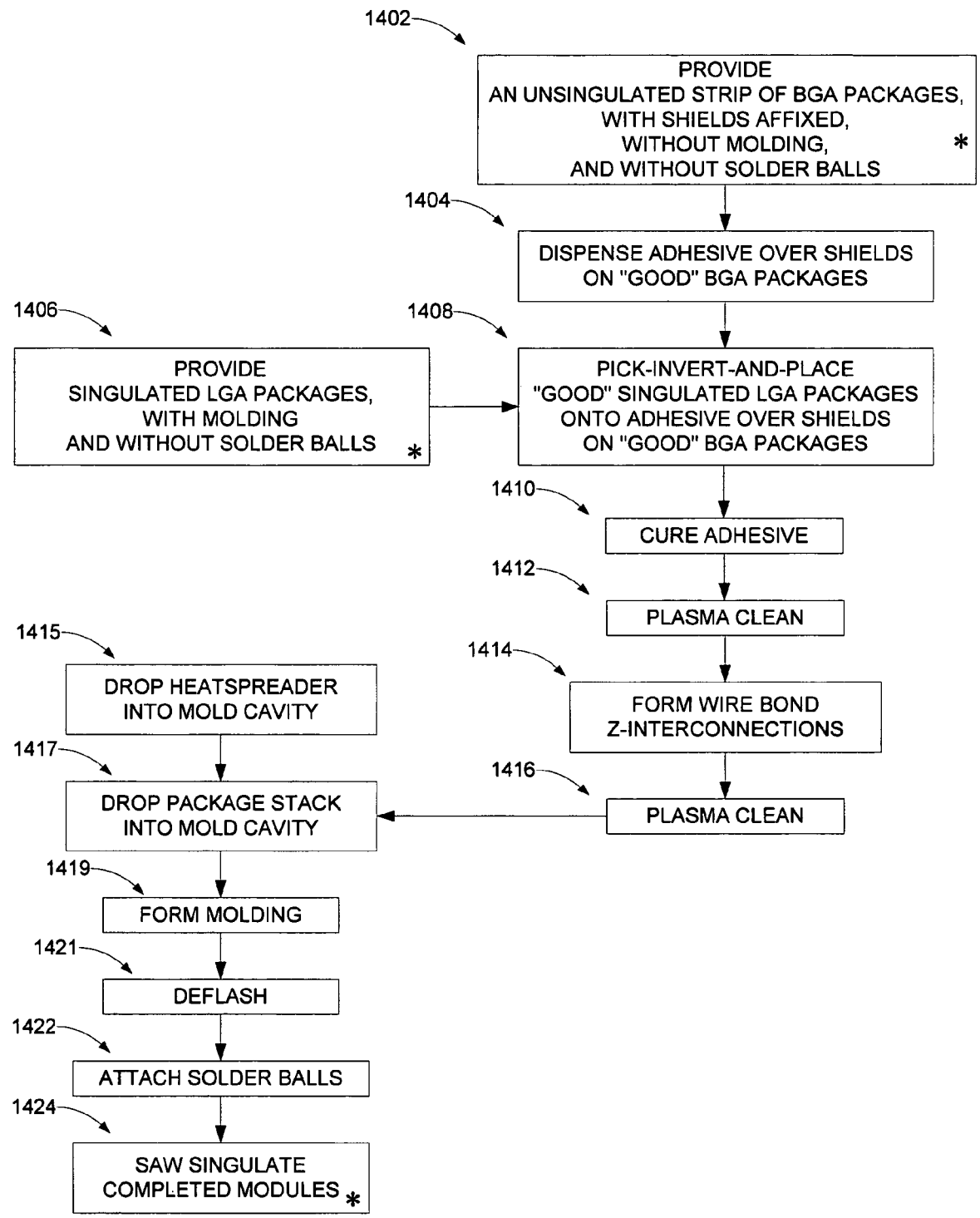
FIG. 14 is a flow diagram showing a process for assembly of a multi-package module according to the invention, in which the bottom package is provided with a heat shield/heat spreader, and the module is further provided with a top heat spreader.

FIG. 14 is a flow diagram showing a process for assembly of a multi-package module, in which the bottom package is provided with a heat shield/heat spreader, and the module is further provided with a top heat spreader. This process is similar to the one shown in FIG. 13, with additional steps interposed for installation of the heat spreader by a "drop-in" mold operation. Like steps in the process are identified by like reference numerals in the FIGS. In a step 1402, an unsingulated strip of ball grid array packages is provided. The BGA packages have shields affixed over the die. The shields protect the die and wire bond structures on the ball grid array packages, and accordingly no package molding is required. The BGA packages in the strip preferably are tested (as indicated in the FIG. by *) for performance and reliability before they are taken to subsequent steps in the process. Only packages identified as "good" are subjected to subsequent treatment. In a step 1404, adhesive is dispensed over the upper surface of the shields on "good" BGA packages. In a step 1406, singulated land grid array packages are provided. The singulated LGA packages are protected by a molding, and preferably are tested (*) and identified as "good". In a step 1408, a pick-and-place operation is carried out to invert and place "good" LGA packages on the adhesive over the shields on the "good" BGA packages. In a step 1410, the adhesive is cured. In a step 1412, a plasma clean operation is performed in preparation for a step 1414 in which wire bond z-interconnections are formed between the stacked top LGA and bottom BGA packages. In a step 1416, an additional plasma clean may be performed. In a step 1415, a heat spreader is dropped into each mold cavity in a cavity molding apparatus. In a step 1417, a clean package stack from step 1416 is dropped into the mold cavity over the heat spreader. In a step 1419, an encapsulation material is injected into the mold cavity, and cured to form the MPM molding. In a step 1421, a deflash operation may be carried out, to decompose and remove undesirable organic material. The deflash may be carried out by laser, or by chemical or plasma clean. In a step 1422, the second-level interconnect solder balls are attached to the underside of the module. In a step 1424, the completed modules are tested (*) and singulated from the strip, for example by saw singulation or by punch singulation, and packaged for further use.

Figure 15:
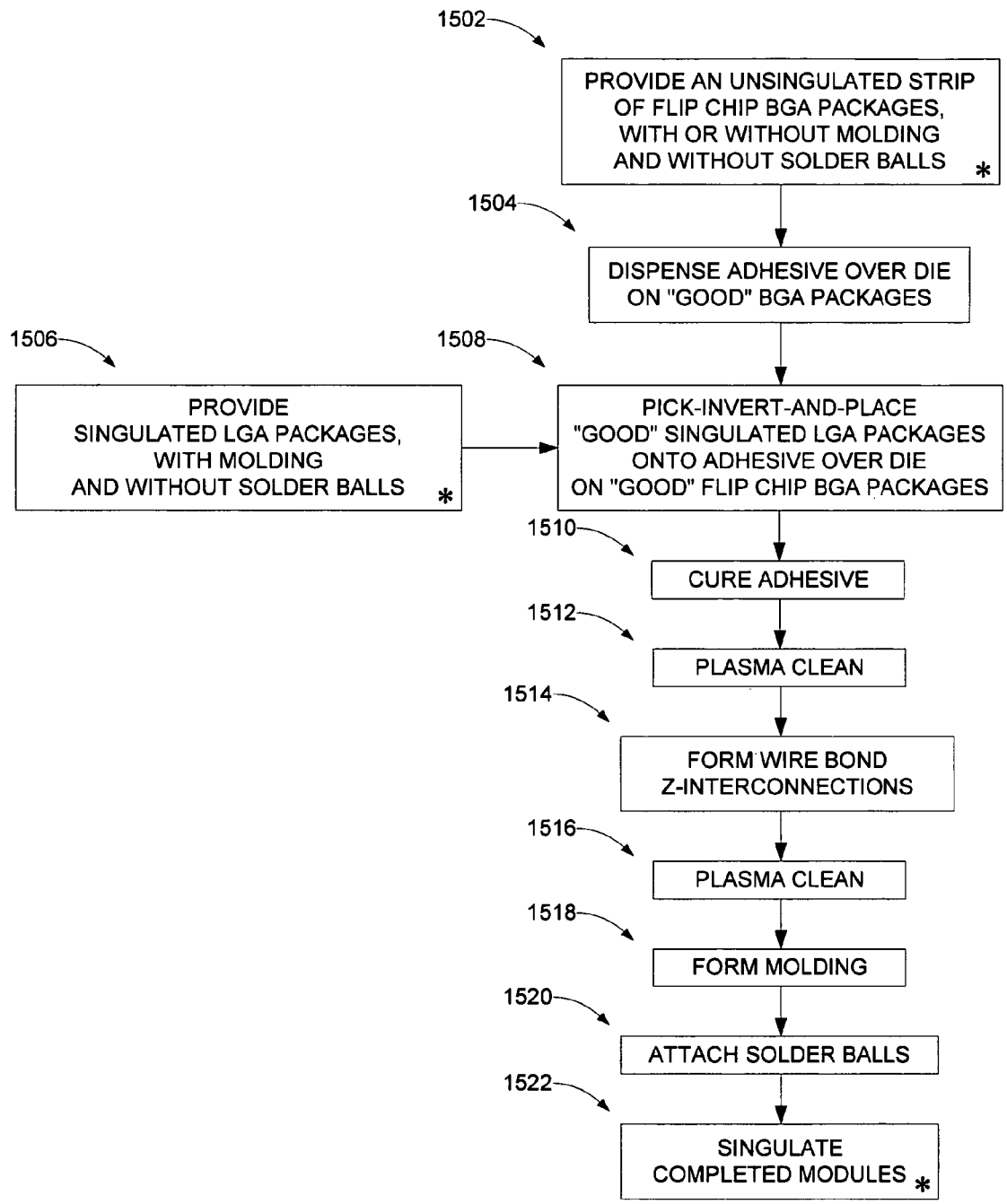
FIG. 15 is a flow diagram showing a process for assembly of a multi-package module according to the invention, in which the bottom package is a flip chip package in a die-down configuration.

FIG. 15 is a flow diagram showing a process for assembly of a multi-package module in which the bottom package is a flip chip package in a die-down configuration. In a step 1502, an unsingulated strip of die-down flip chip ball grid array bottom packages is provided. The BGA packages may or may not be provided with molding, and are provided without second-level interconnect solder balls. The BGA packages in the strip preferably are tested (as indicated in the FIG. by *) for performance and reliability before they are taken to subsequent steps in the process. Only packages identified as "good" are subjected to subsequent treatment. In a step 1504, adhesive is dispensed onto the upper surface (back side) of the die on "good" BGA packages. In a step 1506, singulated land grid array packages are provided. The singulated LGA packages are protected by a molding, and preferably are tested (*) and identified as "good". In a step 1508, a pick-and-place operation is carried out to invert and place "good" LGA packages on the adhesive over the die on the "good" BGA packages. In a step 1510, the adhesive is cured. In a step 1512, a plasma clean operation is performed in preparation for a step 1514 in which wire bond z-interconnections are formed between the stacked top LGA and bottom BGA packages. In a step 1516, an additional plasma clean may be performed, followed by the formation of the MPM molding in a step 1518. In a step 1520, the second-level interconnect solder balls are attached to the underside of the module. In a step 1522, the completed modules are tested (*) and singulated from the strip, for example by saw singulation or by punch singulation, and packaged for further use.

Figure 16:
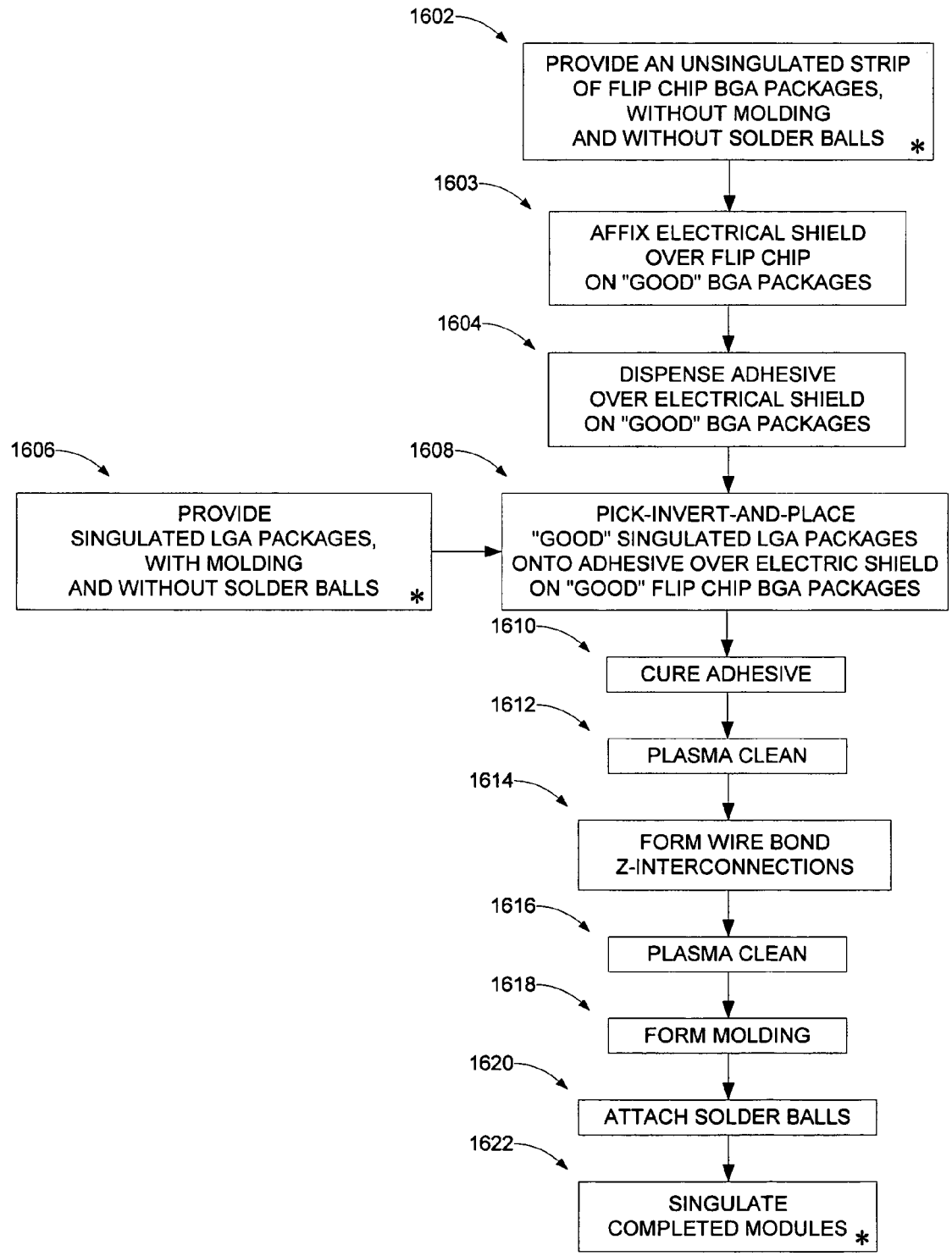
FIG. 16 is a flow diagram showing a process for assembly of a multi-package module according to the invention, in which the bottom package is a flip chip package in a die-down configuration, and the package is provided with a top heat spreader.

FIG. 16 is a flow diagram showing a process for assembly of a multi-package module in which the bottom package is a flip chip package in a die-down configuration, and in which the module os further provided with a heat shield. This process is similar to the one shown in FIG. 15, with an additional step interposed for installation of the shield over the bottom package flip chip die. Like steps in the process are identified by like reference numerals in the FIGS. In a step 1602, an unsingulated strip of die-down flip chip ball grid array bottom packages is provided. The BGA packages may or may not be provided with molding, and are provided without second-level interconnect solder balls. The BGA packages in the strip preferably are tested (as indicated in the FIG. by *) for performance and reliability before they are taken to subsequent steps in the process. Only packages identified as "good" are subjected to subsequent treatment. In a step 1603, the electrical shield is affixed over the die on "good" bottom BGA packages. In a step 1604, adhesive is dispensed onto the upper surface of the shield on "good" BGA packages. In a step 1606, singulated land grid array packages are provided. The singulated LGA packages are protected by a molding, and preferably are tested (*) and identified as "good". In a step 1608, a pick-and-place operation is carried out to invert and place "good" LGA packages on the adhesive over the shields on the "good" BGA packages. In a step 1610, the adhesive is cured. In a step 1612, a plasma clean operation is performed in preparation for a step 1614 in which wire bond z-interconnections are formed between the stacked top LGA and bottom BGA packages. In a step 1616, an additional plasma clean may be performed, followed by the formation of the MPM molding in a step 1618. In a step 1620, the second-level interconnect solder balls are attached to the underside of the module. In a step 1622, the completed modules are tested (*) and singulated from the strip, for example by saw singulation or by punch singulation, and packaged for further use.

Figure 17:
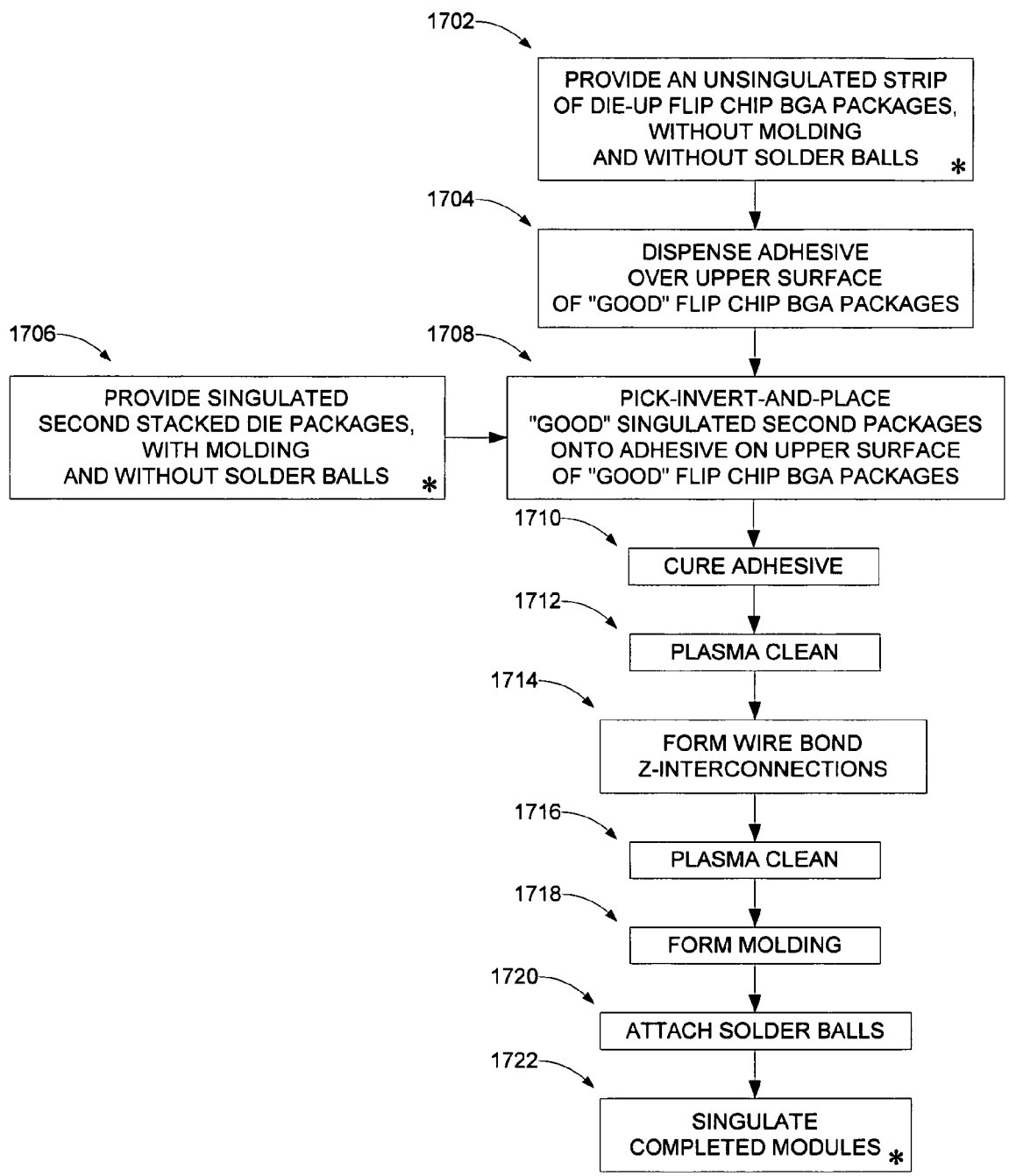
FIG. 17 is a flow diagram showing a process for assembly of a multi-package module according to the invention, in which the bottom package is a flip chip package in a die-up configuration.

FIG. 17 is a flow diagram showing a process for assembly of a multi-package module in which the bottom package is a flip chip package in a die-up configuration. In a step 1702, an unsingulated strip of die-up flip chip ball grid array packages is provided. The flip chip interconnects are protected by an underfill or molding between the die and the die attach surface of the bottom substrate, and so no overmolding is required. The BGA packages in the strip preferably are tested (as indicated in the FIG. by *) for performance and reliability before they are taken to subsequent steps in the process. Only packages identified as "good" are subjected to subsequent treatment. In a step 1704, adhesive is dispensed over the upper surface of the substrate on "good" BGA packages. In a step 1706, singulated second packages are provided, which may be stacked die packages, as for example in FIGS. 10A and 10B. The singulated second packages are protected by a molding, and preferably are tested (*) and identified as "good". In a step 1708, a pick-and-place operation is carried out to invert and place "good" second packages on the adhesive over the substrate on the "good" BGA packages. In a step 1710, the adhesive is cured. In a step 1712, a plasma clean operation is performed in preparation for a step 1714 in which wire bond z-interconnections are formed between the stacked top (stacked die) and bottom die-up flip chip BGA packages. In a step 1716, an additional plasma clean may be performed, followed by the formation of the MPM molding in a step 1718. In a step 1720, the second-level interconnect solder balls are attached to the underside of the module. In a step 1722, the completed modules are tested (*) and singulated from the strip, for example by saw singulation or by punch singulation, and packaged for further use.

Figure 18:
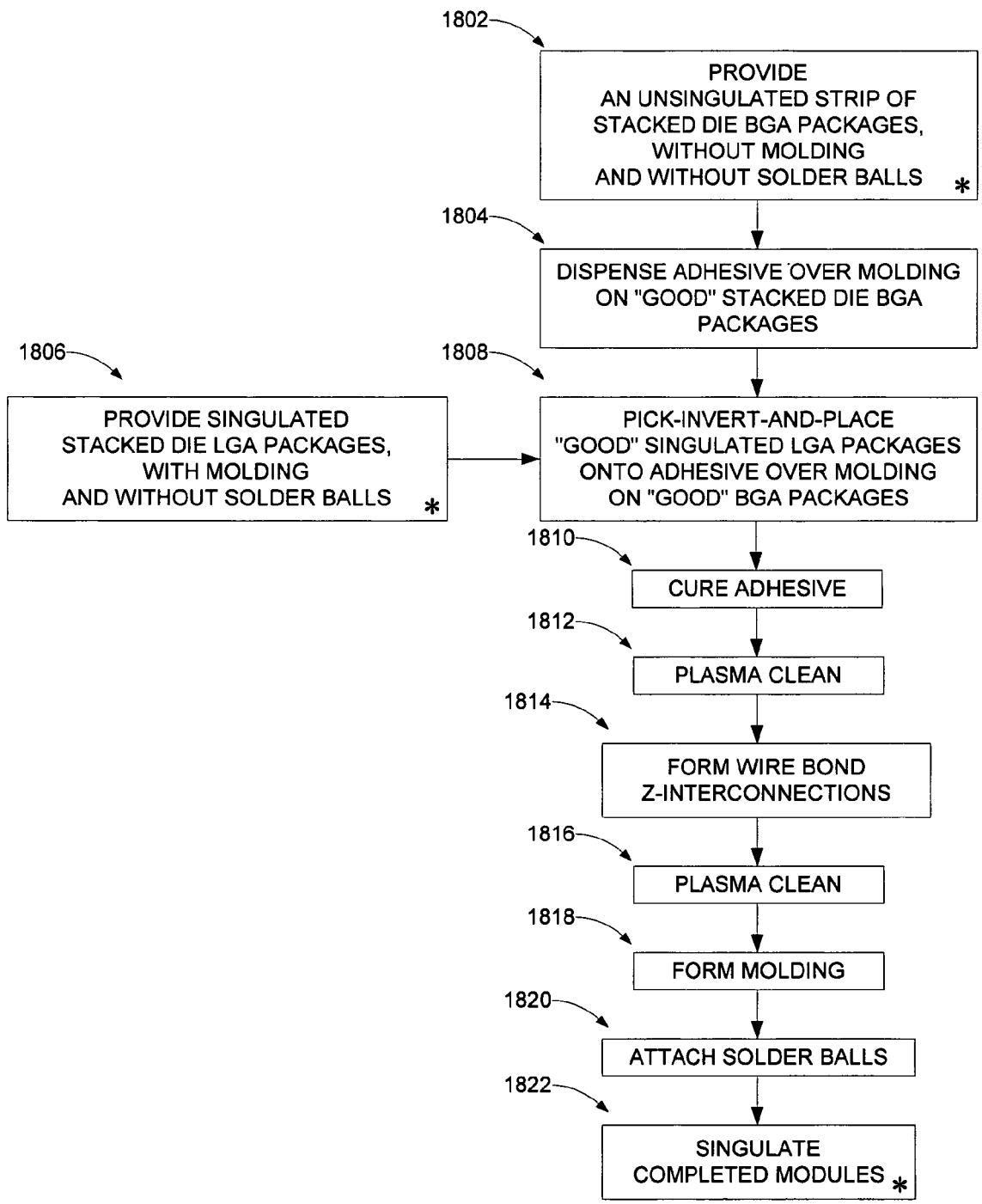
FIG. 18 is a flow diagram showing a process for assembly of a multi-package module according to the invention, in which the top and bottom packages are stacked die packages.

FIG. 18 is a flow diagram showing a process for assembly of a multi-package module in which the top and bottom package are stacked die packages. In a step 1802, an unsingulated strip of stacked die ball grid array packages is provided. The stacked die BGA packages are molded, providing an upper package surface. The BGA packages in the strip preferably are tested (as indicated in the FIG. by *) for performance and reliability before they are taken to subsequent steps in the process. Only packages identified as "good" are subjected to subsequent treatment. In a step 1804, adhesive is dispensed over the upper surface of the substrate on "good" stacked die BGA packages. In a step 1806, singulated second packages are provided, which may be stacked die packages, as for example in FIG. 11. The singulated second packages are protected by a molding, and preferably are tested (*) and identified as "good". In a step 1808, a pick-and-place operation is carried out to invert and place "good" second packages on the adhesive over the substrate on the "good" BGA packages. In a step 1810, the adhesive is cured. In a step 1812, a plasma clean operation is performed in preparation for a step 1814 in which wire bond z-interconnections are formed between the stacked top (stacked die) and bottom die-up flip chip BGA packages. In a step 1816, an additional plasma clean may be performed, followed by the formation of the MPM molding in a step 1818. In a step 1820, the second-level interconnect solder balls are attached to the underside of the module. In a step 1822, the completed modules are tested (*) and singulated from the strip, for example by saw singulation or by punch singulation, and packaged for further use.

As will be appreciated, individual ones of the various steps in the processes according to the invention can be carried out, according to the methods described herein, using substantially conventional techniques, with straightforward modification, as described herein, of conventional fabrication facilities. Such variation of conventional techniques and modification of conventional fabrication apparatus as may be required can be accomplished using the description herein without undue experimentation.

Other embodiments are within the following claims.

What is claimed is:

1. A multi-package module comprising stacked lower and upper packages, each said package including a die attached to a substrate, wherein the substrate comprises a dielectric layer and a pattern patterned metal layer, wherein the upper package is inverted and wherein the upper and lower substrates are interconnected by wire bonding wherein at least one said package is a ball grid array package.

2. The multipackage module of claim 1 wherein at least one said package has wire bond interconnect of the die with the substrate.

3. The multipackage module of claim 1 wherein at least one said package has wire bond interconnect of the die with the substrate, and wherein the said package is fully encapsulated.

4. The multipackage module of claim 1 wherein at least one said package is a land grid array package.

5. The multipackage module of claim 1 wherein at least one said package has flip chip interconnect of the die with the substrate.

6. The multipackage module of claim 1, further comprising a heat spreader.

7. The multipackage module of claim 1, further comprising an electromagnetic shield for at least one of the packages.

8. A computer including a multi-package module, comprising the multi-package module having stacked lower and inverted upper packages of claim 1, said multi-package module being connected to underlying circuitry in the computer.

9. A consumer electronics device including a multi-package module, comprising the multi-package module having stacked lower and inverted upper packages of claim 1, said multi-package module being connected to underlying circuitry in the consumer electronics device.

10. A portable telecommunications device including a multi-package module, comprising the multi-package module having stacked lower and inverted upper packages of claim 1, said multi-package module being connected to underlying circuitry in the portable telecommunications device.

11. A multi-package module comprising stacked lower and upper packages, each said package including a die attached to a substrate, wherein the upper package is inverted and wherein the upper and lower substrates are interconnected by wire bonding, comprising a third package stacked over the upper package.

* * * * *